US007274112B2

(12) United States Patent
Hjort et al.

(10) Patent No.: US 7,274,112 B2
(45) Date of Patent: Sep. 25, 2007

(54) METHOD AND APPARATUS FOR PROVIDING UNINTERRUPTIBLE POWER

(75) Inventors: Thomas Enné Hjort, Vejle (DK); Henning Roar Nielsen, Brenderup (DK)

(73) Assignee: American Power Conversion Corporation, West Kingston, RI (US)

( * ) Notice: Subject to any disclaimer, the term of this patent is extended or adjusted under 35 U.S.C. 154(b) by 269 days.

(21) Appl. No.: 10/930,691

(22) Filed: Aug. 31, 2004

(65) Prior Publication Data

US 2006/0044846 A1    Mar. 2, 2006

(51) Int. Cl.
*H02J 7/00*    (2006.01)
(52) U.S. Cl. .................................................. 307/64
(58) Field of Classification Search .............. 307/64, 307/65, 66, 46, 48
See application file for complete search history.

(56) References Cited

U.S. PATENT DOCUMENTS

| 4,065,711 | A |   | 12/1977 | Kawabata |
| 4,272,717 | A | * | 6/1981  | Bailey ........................ 323/226 |
| 4,621,313 | A | * | 11/1986 | Kiteley ........................ 363/49 |
| 4,648,015 | A | * | 3/1987  | Davis et al. .................. 363/15 |
| 4,673,825 | A | * | 6/1987  | Raddi et al. .................. 307/66 |
| 4,673,826 | A |   | 6/1987  | Masson |
| 4,763,013 | A |   | 8/1988  | Gvoth, Jr. et al. |
| 4,816,982 | A |   | 3/1989  | Severinsky |
| 4,823,247 | A |   | 4/1989  | Tamoto |
| 4,827,151 | A |   | 5/1989  | Okado |
| 4,831,508 | A |   | 5/1989  | Hunter |

(Continued)

FOREIGN PATENT DOCUMENTS

DE    44 40 529 A1    5/1996

(Continued)

OTHER PUBLICATIONS

Invitation to Pay Additional Fees with Partial International Search Report for PCT/US2005/030664 mailed Jun. 6, 2006.

(Continued)

*Primary Examiner*—Adolf Berhane
(74) *Attorney, Agent, or Firm*—Lowrie, Lando & Anastasi, LLP

(57) ABSTRACT

Methods and apparatus for providing uninterruptible power are provided by aspects of the invention. One aspect is more particularly directed to an uninterruptible power supply for providing power to a load. The uninterruptible power supply includes an input to receive input power, an output to provide output power, an input power circuit coupled to the input and having a DC output that provides DC power having a first DC voltage level, a capacitor having a first end coupled to the DC output of the input power circuit and having a second end, a back-up power source coupled to the input power circuit, an output power circuit coupled to the DC output of the input power circuit and to the output of the uninterruptible power supply to provide the output power, and a capacitor discharge circuit coupled to the first end of the capacitor and the second end of the capacitor and configured in a first mode of operation to discharge a voltage across the capacitor, such that an average discharge current through the discharge circuit is inversely proportional to a voltage across the capacitor for a first range of voltages across the capacitor.

17 Claims, 15 Drawing Sheets

U.S. PATENT DOCUMENTS

| | | | |
|---|---|---|---|
| 4,964,029 A | 10/1990 | Severinsky et al. | |
| 5,126,585 A | 6/1992 | Boys | |
| 5,142,163 A | 8/1992 | Hase | |
| 5,142,169 A | 8/1992 | Hüser | |
| 5,148,043 A | 9/1992 | Hirata et al. | |
| 5,198,698 A | 3/1993 | Paul et al. | |
| 5,241,217 A | 8/1993 | Severinsky | |
| 5,264,732 A | 11/1993 | Fiorina et al. | |
| 5,289,046 A * | 2/1994 | Gregorich et al. | 307/66 |
| 5,291,383 A | 3/1994 | Oughton | |
| 5,302,858 A | 4/1994 | Folts | |
| 5,422,558 A | 6/1995 | Stewart | |
| 5,458,991 A | 10/1995 | Severinsky | |
| 5,465,011 A | 11/1995 | Miller et al. | |
| 5,616,968 A | 4/1997 | Fujii et al. | |
| 5,686,768 A | 11/1997 | Thomsen et al. | |
| 5,796,223 A | 8/1998 | Ohtsuka et al. | |
| 5,844,328 A | 12/1998 | Furst | |
| 5,969,436 A | 10/1999 | Chalasani et al. | |
| 5,982,652 A * | 11/1999 | Simonelli et al. | 363/142 |
| 5,998,886 A | 12/1999 | Hoshino et al. | |
| 6,169,669 B1 | 1/2001 | Choudhury | |
| 6,184,593 B1 | 2/2001 | Jungreis | |
| 6,201,319 B1 | 3/2001 | Simonelli et al. | |
| 6,274,950 B1 | 8/2001 | Gottlieb et al. | |
| 6,424,119 B1 | 7/2002 | Nelson et al. | |
| 6,493,243 B1 | 12/2002 | Real | |
| 6,629,247 B1 | 9/2003 | Hall et al. | |
| 6,728,119 B2 | 4/2004 | Reilly et al. | |
| 6,784,641 B2 | 8/2004 | Sakai et al. | |
| 6,803,678 B2 | 10/2004 | Gottlieb et al. | |
| 6,838,925 B1 | 1/2005 | Nielsen | |
| 6,949,843 B2 | 9/2005 | Dubovsky | |
| 6,958,550 B2 | 10/2005 | Gilbreth et al. | |
| 6,983,212 B2 | 1/2006 | Burns | |
| 7,012,825 B2 | 3/2006 | Nielsen | |
| 2001/0033502 A1 | 10/2001 | Blair et al. | |
| 2003/0099371 A1 | 5/2003 | Ogura et al. | |
| 2003/0111842 A1 | 6/2003 | Gilbreth et al. | |
| 2003/0184160 A1 | 10/2003 | Yamamoto | |
| 2003/0220026 A1 | 11/2003 | Oki et al. | |
| 2004/0155526 A1 | 8/2004 | Naden et al. | |
| 2005/0036248 A1 | 2/2005 | Klikic et al. | |
| 2005/0162019 A1 | 7/2005 | Masciarelli et al. | |
| 2005/0162129 A1 | 7/2005 | Mutabdzija et al. | |
| 2005/0162836 A1 | 7/2005 | Briggs et al. | |
| 2006/0043792 A1 | 3/2006 | Hjort et al. | |
| 2006/0043793 A1 | 3/2006 | Hjort et al. | |
| 2006/0043797 A1 | 3/2006 | Hjort et al. | |

FOREIGN PATENT DOCUMENTS

EP    1 187 298 A2    3/2002

OTHER PUBLICATIONS

Patent Abstracts of Japan, JP 11146575 A (NEC Corp.), May 28, 1999, 1 pg.

Patent Abstracts of Japan, JP 2004120857 A (Nippon Telegr & Teleph Corp.), Apr. 15, 2004, 1 pg.

International Search Report for PCT/US2005/030664 mailed Nov. 13, 2006.

* cited by examiner

METHOD AND APPARATUS FOR PROVIDING UNINTERRUPTIBLE POWER

FIELD OF THE INVENTION

The present invention relates generally to a system and method for providing redundant power to critical loads.

BACKGROUND OF THE INVENTION

The use of an uninterruptible power system (UPS) to provide power to a critical load is well known. Known uninterruptible power systems include on-line UPS's and off-line UPS's. On-line UPS's provide conditioned AC power as well as back-up AC power upon interruption of a primary source of AC power. Off-line UPS's typically do not provide conditioning of input AC power, but do provide back-up AC power upon interruption of the primary AC power source. FIG. 1 shows a block diagram of one type of on-line UPS 10. Other on-line UPS's are described in U.S. Pat. No. 5,982,652, and U.S. Pat. No. 5,686,768, both of which are incorporated herein by reference. On-line UPS's of the type described in the referenced patents are available from American Power Conversion Corporation, West Kingston, R.I. under the trade names Symmetra and Silcon. The UPS 10A of FIG. 1 includes an input circuit breaker/filter 12, a rectifier 14, a control switch 15, a controller 16, a battery 18, an inverter 20, an isolation transformer 22, and a bypass switch 23. The UPS also includes an input 24 for coupling to an AC power source, and an outlet 26 for coupling to a load.

The UPS 10A operates as follows. The circuit breaker/filter 12 receives input AC power from the AC power source through the input, filters the input AC power and provides filtered AC power to the rectifier 14. The rectifier rectifies the input voltage. The control switch 15 receives the rectified power and also receives DC power from the battery 18. The controller 16 determines whether the power available from the rectifier is within predetermined tolerances, and if so, controls the control switch to provide the power from the rectifier to the inverter 20. If the power from the rectifier is not within the predetermined tolerances, which may occur because of "brown out" or "black out" conditions, or due to power surges, then the controller controls the control switch to provide the DC power from the battery to the inverter 20.

The inverter 20 of the UPS 10A receives DC power and converts the DC power to AC power and regulates the AC power to predetermined specifications. The inverter 20 provides the regulated AC power to the isolation transformer 22. The isolation transformer is used to increase or decrease the voltage of the AC power from the inverter and to provide isolation between a load and the UPS. The isolation transformer is typically an optional device, the use of which is typically dependent on UPS output power specifications. Depending on the capacity of the battery and the power requirements of the load, the UPS 10A can provide power to the load during brief power source dropouts or for extended power outages. The bypass switch 23 is used to provide a bypass of UPS circuitry to provide the input power directly to the output. The bypass switch may be controlled by the controller 16 to provide bypass of the UPS circuitry upon a failure condition of the UPS.

To provide further power redundancy, it is known to use a second power source to supply power to a bypass switch of a UPS from a second source of AC power. Systems of this type are often referred to as dual mains systems. FIG. 2 shows a dual mains UPS 10B that is similar to UPS 10A except that it includes a second input to couple to a second power supply, and UPS 10B includes a bypass switch 23 that selectively couples the second input directly to the output of the UPS 10B. In dual main systems, typically, a utility power source is coupled to the first power input of the system and a backup power source, such as a generator is coupled to the second power input of the system. Upon failure of the utility power source, the power system is able to continue to provide power to a load using the battery mode of operation of the UPS, while the generator is powered on and brought to full output voltage. Once the generator is on line, the power system can continue to provide output power in a bypass mode for an extended period of time from the generator.

Dual main systems may also be used with both power inputs coupled to the same source of input power, but through separate fuses and/or circuit breakers. For many types of power failures, the power will be lost at both input 1 and input 2, but situations may exist, such as a blown fuse or circuit breaker, where power is lost at only input 1, and the bypass switch can be used to continue to provide output power to a load.

One problem with dual mains systems is that in bypass mode, it is not normally possible to charge the batteries of the UPS, which will typically be at least partially drained when input power is being supplied by a source at input 2.

SUMMARY OF THE INVENTION

Embodiments of the present invention provide improved power systems. In one aspect an uninterruptible power supply for providing power to a load is provided. The uninterruptible power supply includes an input to receive input power, an output to provide output power, an input power circuit coupled to the input and having a DC output that provides DC power having a first DC voltage level, a capacitor having a first end coupled to the DC output of the input power circuit and having a second end, a back-up power source coupled to the input power circuit, an output power circuit coupled to the DC output of the input power circuit and to the output of the uninterruptible power supply to provide the output power, and a capacitor discharge circuit coupled to the first end of the capacitor and the second end of the capacitor and configured in a first mode of operation to discharge a voltage across the capacitor, such that an average discharge current through the discharge circuit is inversely proportional to a voltage across the capacitor for a first range of voltages across the capacitor.

The capacitor discharge circuit may be configured in a second mode of operation such that the discharge current through the discharge circuit is proportional to the voltage across the capacitor for a second range of voltages that is less than the first range of voltages. The capacitor discharge circuit may be configured in the first mode of operation to control the discharge current, such that the discharge current has a waveform containing a series of pulses with a duty cycle of the pulses being inversely proportional to the voltage across the capacitor over at least the first range of voltages. The first range of voltages may be equal to a range of voltages from a lower threshold level to the first DC voltage level, and the second range of voltages may be equal to a range of voltages from zero to the lower threshold level. The capacitor discharge circuit may include a passive discharge circuit having an input coupled to the first end of the capacitor and an output, a switch having an input coupled to the output of the passive discharge circuit and an output coupled to the second end of the capacitor, and a control circuit coupled to the switch to control an operational state of the switch based on the voltage across the capacitor.

Another aspect of the invention is directed to an uninterruptible power supply for providing power to a load. The uninterruptible power supply includes an input to receive input power, an output to provide output power, an input power circuit coupled to the input and having a DC output that provides DC power having a first DC voltage level, a capacitor having a first end coupled to the DC output of the input power circuit and having a second end, a back-up power source coupled to the input power circuit, an output power circuit coupled to the DC output of the input power circuit and to the output of the uninterruptible power supply to provide the output power, and means for discharging a voltage across the capacitor, such that an average discharge current of the capacitor is inversely proportional to a voltage across the capacitor for a first range of voltages across the capacitor.

The uninterruptible power supply may further include means for discharging the voltage across the capacitor such that the discharge current is proportional to the voltage across the capacitor for a second range of voltages that is less than the first range of voltages, and may further include means for discharging the voltage across the capacitor such that the discharge current has a waveform containing a series of pulses with a duty cycle of the pulses being inversely proportional to the voltage across the capacitor over at least the first range of voltages. The first range of voltages may be equal to a range of voltages from a lower threshold level to the first DC voltage level, and the second range of voltages may be equal to a range of voltages from zero to the lower threshold level.

Another aspect of the invention is directed to a method of discharging a voltage across a capacitor in a uninterruptible power supply. The method includes charging the capacitor to a first voltage value, detecting the voltage across the capacitor, and discharging the capacitor using a discharge current having an average value that is inversely proportional to the voltage across the capacitor, such that over at least a first range of voltages across the capacitor, the average value of the discharge current increases as the voltage across the capacitor decreases.

The method may further include during discharge of the capacitor, detecting that the voltage across the capacitor has decreased to a second voltage value, less than the first voltage value, and discharging the capacitor using a discharge current having an average value that is proportional to the voltage across the capacitor, such that for a second range of voltages the average value of the discharge current decreases as the voltage across the capacitor decreases. The method may further include controlling the discharge current, while the voltage across the capacitor is within the first voltage range, such that the discharge current has a waveform containing a series of pulses with a duty cycle of the pulses being inversely proportional to the voltage across the capacitor over the first range of voltages. The method may still further include controlling the discharge current to be continuous over the second range of voltages. The first range of voltages may be equal to a range of voltages from the first voltage value to the second voltage value, and the second range of voltages may be equal to a range of voltages from the second voltage value to a voltage level of zero.

Another aspect of the invention is directed to an uninterruptible power supply for providing power to a load. The uninterruptible power supply includes a first input to receive input power from an input power source, an output to provide output power, a bypass input to receive bypass power from a bypass power source, wherein the bypass input is selectively coupled to the output to provide output power from the bypass power source, an input power circuit coupled to the first input and having a DC output that provides DC power having a first DC voltage level, a back-up power source coupled to the input power circuit to provide DC power at the DC output in a back-up mode of operation, and an inverter circuit coupled to the DC output of the input power circuit and to the output to provide the output power derived from at least one of the input power source and the back-up power source. The uninterruptible power supply is constructed and arranged in a bypass mode of operation to control the inverter circuit to convert AC power from the bypass power source at the output of the inverter circuit to DC power at the input of the inverter circuit.

The uninterruptible power supply may include a battery charger coupled to the input of the inverter to receive DC power and provide power to charge the back-up power source in the bypass mode of operation, and may further include a power supply coupled to the input of the inverter circuit to receive DC power and to provide DC power to components of the uninterruptible power supply in the bypass mode of operation. The back-up power source may include at least one battery. The first input and the bypass input may be configured to be coupled to a common source of power. The uninterruptible power supply may include a bypass switch coupled between the bypass input and the output of the inverter circuit and controlled to operate in a closed position in the bypass mode of operation.

Another aspect of the invention is directed to an uninterruptible power supply for providing power to a load. The uninterruptible power supply includes a first input to receive input power, an output to provide output power, a bypass input to receive bypass power, wherein the bypass input is selectively coupled to the output to provide output power from the bypass power, an input power circuit coupled to the first input and having a DC output that provides DC power having a first DC voltage level, a back-up power source coupled to the input power circuit to provide DC power at the DC output in a back-up mode of operation, an inverter circuit coupled to the DC output of the input power circuit and to the output to provide the output power derived from at least one of the input power and power from the back-up power source, and means for controlling the inverter circuit in a bypass mode of operation to convert AC power from the bypass power source at the output of the inverter circuit to DC power at the input of the inverter circuit.

The uninterruptible power supply may include means for charging the back-up power source in the bypass mode of operation, and may further include a power supply coupled to the input of the inverter circuit to receive DC power and to provide DC power to components of the uninterruptible power supply in the bypass mode of operation. The back-up power source may include at least one battery. The uninterruptible power supply may include a bypass switch coupled between the bypass input and the output of the inverter circuit and controlled to operate in a closed position in the bypass mode of operation. The means for controlling the inverter circuit may include means for controlling power factor at the input of the inverter circuit in bypass mode of operation.

Another aspect of the invention is directed to a method for providing uninterrupted power from a power supply having a first input, a bypass input and an output from which power is provided, the power supply further including a source of back-up power and an inverter that converts DC power to AC power for use at the output of the power supply. The method includes operating the power supply in a first mode of operation with power at the output being supplied from the inverter and derived from power at the first input, operating in a bypass mode with power at the output being supplied from power at the bypass input, and in the bypass mode, operating the inverter to provide DC power at an input of the inverter from AC power at an output of the inverter.

The back-up power source may be coupled to the input of the inverter, and the method may include charging the back-up power source in the bypass mode. The back-up power source may include a battery, and charging the back-up power source may include using DC power at the input of the inverter to charge the battery. The method may include operating in a back-up mode of operation with power at the output being derived from power from the back-up power source. The power supply may further include a power supply unit coupled to the input of the inverter, and the method may include powering the power supply unit from the DC power at the input of the inverter in bypass mode. The method may include controlling current through the inverter in the bypass mode to be substantially in phase with voltage at the output of the inverter. The method may include sensing a voltage at the input of the inverter in bypass mode and controlling the inverter to maintain the voltage at the input of the inverter at a predetermined value.

Another aspect of the invention is directed to an uninterruptible power supply for providing power to a load. The uninterruptible power supply includes an input to receive input power, an output to provide output power, a back-up power source coupled to the output to provide backup power at the output, a contactor coupled to the input and having an open state and a closed state, a contactor control circuit having an output coupled to the contactor to provide an output voltage to control an operational state of the contactor, the contactor control circuit being configured to provide an output voltage having a first voltage level to the contactor to control the contactor to switch from the open state to the closed state and to provide a second output voltage having a second voltage level to maintain the contactor in the closed state.

The contactor control circuit may be configured to provide a zero voltage level to the contactor to place the contactor in the open state. The contactor control circuit may include a power converter that receives an input voltage and provides the output voltage to the contactor, a switch coupled between the power converter and the contactor, and a switch control circuit coupled to the switch and adapted to receive an input signal and control the switch to selectively couple the output of the contactor control circuit to the contactor. The switch control circuit may include an output coupled to the power converter to control the output voltage of the power converter. The power converter may include a capacitor configured such that the output voltage of the contactor control circuit is across the capacitor. The switch may include a first switch coupled in series with a second switch, such that the output voltage of the contactor control circuit is applied to the contactor when both the first switch and the second switch are in a closed state. The uninterruptible power supply may further include an input circuit coupled through the contactor to the input of the uninterruptible power supply to receive input power and coupled to the back-up power source to receive back-up power and configured to provide DC power derived from at least one of the input power and the back-up power, and an output circuit coupled to the input circuit to receive the DC power, and configured to provide AC power, derived from the DC power, at the output of the uninterruptible power supply. The uninterruptible power supply may further include a power supply unit having an input coupled to the input of the uninterruptible power supply to receive input power and an output coupled to the power converter to provide the input voltage to the power converter.

Another aspect of the invention is directed to a method for controlling a contactor contained in an uninterruptible power supply having an output that provides output power from one of a primary power source and a back-up power source. The method includes detecting presence of AC power from the primary power source, applying a voltage having a first value to the contactor to change a state of the contactor to closed from open, and applying a voltage having a second value to the contactor after the contactor has changed from open to closed to maintain the contactor in the closed state.

The method may further include detecting a loss of AC power from the primary power source, and removing the voltage from the contactor to open the contactor. The stage of applying a voltage having the first value may include coupling a capacitor charged to the first value across the contactor. The stage of applying a voltage having the second value may include allowing the capacitor to discharge until the voltage across the capacitor is equal to the second value. The stage of applying a voltage having a first value may include controlling a pair of switches coupled in series such that each of the switches is turned to a closed state to apply the voltage to the contactor. The method may further include coupling a power supply unit to the primary power source, and charging the capacitor using voltage derived from an output of the power supply unit. The stage of charging the capacitor may include coupling a boost circuit between the output of the power supply unit and the capacitor and controlling the boost circuit to generate a voltage having the first voltage value across the capacitor and to generate a voltage having the second voltage value across the capacitor.

Another aspect of the invention is directed to an uninterruptible power supply for providing power to a load. The uninterruptible power supply includes an input to receive input power, an output to provide output power, a back-up power source coupled to the output to provide backup power at the output, a contactor coupled to the input and having an open state and a closed state, and means for providing an output voltage having a first voltage level to the contactor to control the contactor to switch from the open state to the closed state and for providing a second output voltage having a second voltage level to maintain the contactor in the closed state.

The uninterruptible power supply may include means for providing a zero voltage level to the contactor to place the contactor in the open state, and may further include a power supply unit having an input coupled to the input of the uninterruptible power supply to receive input power and an output that provides a power supply output voltage, and means for converting the power supply output voltage to the first voltage level and the second voltage level. The means for providing an output voltage may include a capacitor and means for selectively coupling the capacitor across the contactor. The means for providing an output voltage includes means for charging the capacitor to a voltage having the first voltage level and for discharging the capacitor until the voltage across the capacitor is equal to the second voltage level. The means for selectively coupling the capacitor may include a pair of switches coupled in series such that each of the switches is turned to a closed state to apply voltage to the contactor.

Yet another aspect of the invention is directed to an uninterruptible power supply for providing power to a load. The uninterruptible power supply includes an input to receive input power, an output to provide output power, a plurality of battery modules that provide backup power, a power circuit coupled to the input, coupled to the plurality of battery modules and coupled to the output to provide power derived from at least one of the input power and the backup power to the output, a controller, a return line coupled to the controller and coupled to each of the battery modules, and a first sense line coupled to the controller and coupled to the plurality of battery modules. The controller and each of the battery modules are configured and arranged such that at least one characteristic of the battery modules is determined by the controller based on signals detected by the controller on the first sense line.

The at least one characteristic of the battery modules detected may include a total capacity of the plurality of battery modules. Each of the battery modules may include a resistor coupled between the first sense line and the return line, and the controller may detect a voltage across the first sense line and the return line and determine total capacity based on the voltage detected. The total capacity may be determined in terms of ampere-hours. The uninterruptible power supply may further include a power supply line having a first end coupled to the plurality of battery modules, and a power supply coupled to a second end of the power supply line and coupled to the return line that generates an output voltage across the power supply line and the return line, and the voltage across the resistor in each of the plurality of battery modules may be derived from the output voltage of the power supply. Each of the resistors in each of the plurality of battery modules may have approximately a same resistance value. At least one of the plurality of battery modules may include a plurality of battery units. The first sense line, the return line and the power supply line may be directly coupled to a first one of the plurality of battery modules and coupled to each remaining battery module using a daisy chain. The uninterruptible power supply may further include a battery frame that contains at least one of the plurality of battery modules, and the first sense may be further coupled to the battery frame, and the controller and the battery frame may be configured and arranged such that the controller can detect a blown fuse in the battery frame.

The uninterruptible power supply may still further include a second sense line coupled to the controller and coupled to each of the plurality of battery modules, and the controller and the battery modules may be configured and arranged such that the controller determines a highest temperature present in the plurality of battery modules based on a voltage across the second sense line and the return line. Each of the plurality of battery modules may include a variable resistor having a resistance value that varies with temperature coupled to the second sense line. Each of the plurality of battery modules may include a diode coupled between the variable resistor and the second sense line. The uninterruptible power supply may further include a power supply line having a first end coupled to the plurality of battery modules, and a power supply coupled to a second end of the power supply line and coupled to the return line that generates an output voltage across the power supply line and the return line, and the voltage across the resistor in each of the plurality of battery modules may be derived from the output voltage of the power supply. The uninterruptible power supply may further include a second sense line coupled to the controller and coupled to each of the plurality of battery modules, and the controller and the battery modules may be configured and arranged such that the controller determines a highest temperature present in the plurality of battery modules based on a voltage across the second sense line and the return line.

Another aspect of the invention is directed to an uninterruptible power supply for providing power to a load. The uninterruptible power supply includes an input to receive input power, an output to provide output power, a plurality of battery modules that provide backup power, a power circuit coupled to the input, coupled to the plurality of battery modules and coupled to the output to provide power derived from at least one of the input power and the backup power to the output, a return line coupled to each of the battery modules, a first sense line coupled to the plurality of battery modules, and means for determining at least one characteristic of the battery modules based on signals detected on the first sense line.

The means for determining may include means for determining a total capacity of the plurality of battery modules. The total capacity may be determined in terms of ampere-hours. The uninterruptible power supply may further include a power supply line having a first end coupled to the plurality of battery modules, and a power supply coupled to a second end of the power supply line and coupled to the return line that generates an output voltage across the power supply line and the return line. The at least one of the plurality of battery modules may include a plurality of battery units. The first sense line, the return line and the power supply line may be directly coupled to a first one of the plurality of battery modules and coupled to each remaining battery module using a daisy chain. The uninterruptible power supply may further include a battery frame that contains at least one of the plurality of battery modules, wherein the first sense line is further coupled to the battery frame, and means for detecting a blown fuse in the battery frame. The uninterruptible power supply may further include a second sense line coupled to each of the plurality of battery modules, and means for determining a highest temperature present in the plurality of battery modules based on a voltage across the second sense line and the return line. Each of the plurality of battery modules may include a variable resistor having a resistance value that varies with temperature coupled to the second sense line. Each of the plurality of battery modules may include a diode coupled between the variable resistor and the second sense line.

Still another aspect of the invention is directed to a method of monitoring devices in an uninterruptible power supply having an input that receives input power, a plurality of battery modules that provide backup power, and an output that provides output power derived from at least one of the input power and the backup power. The method includes coupling a first sense line to each of the plurality of battery modules, coupling a return line to each of the battery modules, determining at least one characteristic of the battery modules based on a voltage level detected on the first sense line.

The stage of determining at least one characteristic may include determining a total capacity of the plurality of battery modules. The total capacity may be determined in terms of ampere-hours. The uninterruptible power supply may further include a power supply unit, and the method may further include coupling a first end of a power supply line to the plurality of battery modules, and coupling a second end of the power supply line to the power supply to generate an output voltage across the power supply line and the return line. The stage of coupling the first sense line, the return line and the power supply line to the plurality of battery modules may include directly coupling the first sense line, the return line and the power supply line to a first one of the plurality of battery modules and coupling each remaining battery module using a daisy chain. The uninterruptible power supply may include a battery frame, and the method may further include detecting a blown fuse in the battery frame. The method may still further include coupling a second sense line to each of the plurality of battery modules, and determining a highest temperature present in the plurality of battery modules based on a voltage across the second sense line and the return line.

Another aspect of the invention is directed to an uninterruptible power supply for providing power to a load. The uninterruptible power supply includes an input to receive input power, an output to provide output power, a backup power device that provides backup power, a power circuit coupled to the input, coupled to the backup power device and coupled to the output to provide power derived from at least one of the input power and the backup power to the output, the power circuit having a first power interface module having a plurality of first power modules. The uninterruptible power supply further includes a controller, a first sense line coupled to the controller and coupled to the first power interface module and the plurality of first power modules, and a return line coupled to the controller and coupled to the first power interface module and the plurality of first power modules. The controller, the first power interface module and the plurality of first power modules are configured and arranged such that the controller identifies a revision level of the first power interface module and a revision level of the plurality of first power modules, based on a voltage level detected by the controller across the first sense line and the return line.

The power circuit may include a second power interface module having a plurality of second power modules, wherein the first sense line is coupled to the second power interface module and the plurality of second power modules of the second power interface module, and wherein the controller, the second power interface module and the plurality of second power modules are configured and arranged such that the controller identifies a revision level of the second power interface module and a revision level of the plurality of second power modules, based on the voltage level detected by the controller across the first sense line and the return line. The controller and the plurality of first power modules may be further configured and arranged to allow the controller to identify a high temperature condition in one of the first power modules based on the voltage across the first sense line and the return line. The controller, the plurality of first power modules and the plurality of second power modules may be arranged to allow the controller to identify a high temperature condition in one of the first power modules or the second power modules based on the voltage across the first sense line and the return line. The controller may be configured to adjust control parameters of the uninterruptible power supply based on the revision detected of the first power interface board and the revision detected of the plurality of first power modules. Each of the first power interface module and the plurality of first power modules may include a resistor coupled to the first sense line and the return line, wherein a resistance value of the resistor identifies a revision level. Each of the plurality of first power modules includes a thermal switch coupled between the first sense line and the return line.

Still another aspect of the invention is directed to an uninterruptible power supply for providing power to a load. The uninterruptible power supply includes an input to receive input power, an output to provide output power, a backup power device that provides backup power, a power circuit coupled to the input, coupled to the backup power device and coupled to the output to provide power derived from at least one of the input power and the backup power to the output, the power circuit having a first power interface module having a plurality of first power modules. The uninterruptible power supply further includes a first sense line coupled to the first power interface module and the plurality of first power modules, and a return line coupled to the first power interface module and the plurality of first power modules, and means for identifying a revision level of the first power interface module and a revision level of the plurality of first power modules, based on a voltage level detected across the first sense line and the return line.

The power circuit may include a second power interface module having a plurality of second power modules, and the first sense line may be coupled to the second power interface module and the plurality of second power modules of the second power interface module, and the uninterruptible power supply may further include means for identifying a revision level of the second power interface module and a revision level of the plurality of second power modules, based on the voltage level detected across the first sense line and the return line. The uninterruptible power supply may further include means for identifying a high temperature condition in one of the first power modules based on the voltage across the first sense line and the return line, and may include means for identifying a high temperature condition in one of the first power modules or the second power modules based on the voltage across the first sense line and the return line. The uninterruptible power supply may also include means for controlling parameters of the uninterruptible power supply based on the revision detected of the first power interface board and the revision detected of the plurality of first power modules.

Still another aspect of the invention is directed to a method for controlling an uninterruptible power supply having a first power interface module and a plurality of power modules coupled to the first power interface module. The method includes coupling a first sense line to the first power interface module and the plurality of first power modules, coupling a return line to the first power interface module and the plurality of first power modules, identifying a revision level of the first power interface module and a revision level of the plurality of first power modules, based on a voltage level detected across the first sense line and the return line, and controlling parameters of the uninterruptible power supply based on the revision level of the first power interface board and the revision level of the plurality of first power modules.

The uninterruptible power supply may include a second power interface module having a plurality of second power modules, and the method may further include coupling the first sense line to the second power interface module and the plurality of second power modules of the second power interface module, and identifying a revision level of the second power interface module and a revision level of the plurality of second power modules, based on the voltage level detected across the first sense line and the return line. The method may further include identifying a high temperature condition in one of the first power modules based on the voltage across the first sense line and the return line. The method may still further include identifying a high temperature condition in one of the first power modules or the second power modules based on the voltage across the first sense line and the return line.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
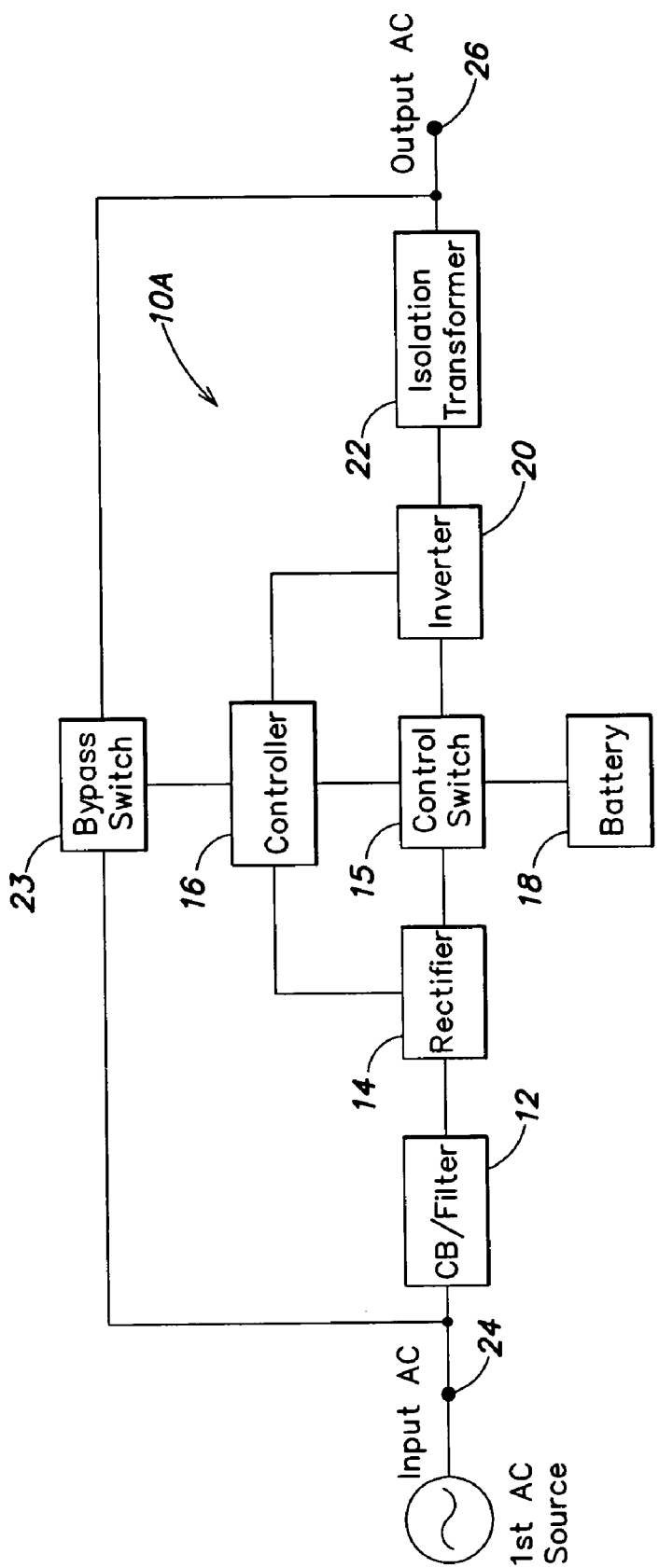
FIG. 1 is a functional block diagram of a first prior art UPS system.
Figure 2:
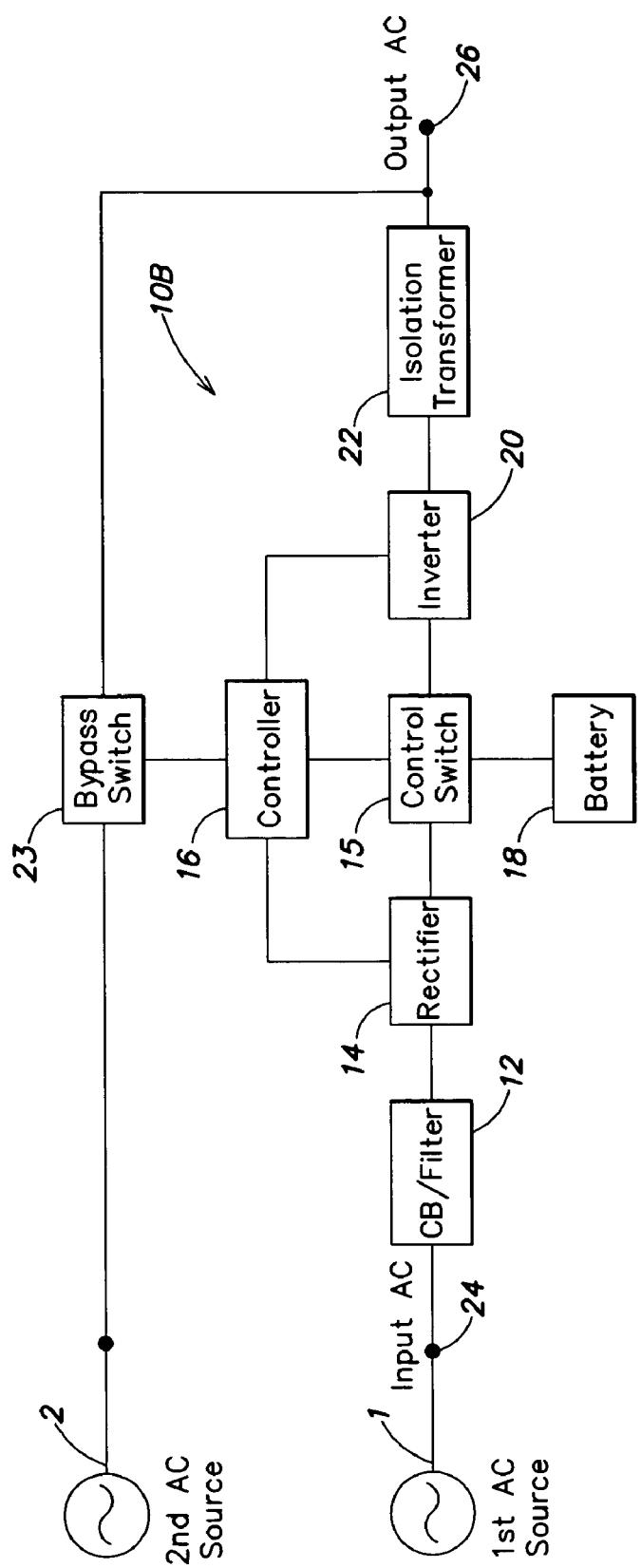
FIG. 2 is a functional block diagram of a second prior art UPS system.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

Embodiments of the present invention provide cost-effective, high availability power solutions. One embodiment of an uninterruptible power system 100 in accordance with the present invention will now be described with reference to FIG. 3, which shows a functional block diagram of the UPS 100. The UPS 100 includes a rectifier/power factor correction (PFC) circuit 114, a controller 116, a battery 118, an inverter 120, a bypass switch 123, a battery charger 125, a power supply unit (PSU) 127, an inverter relay 132, a DC bus 133, and contactors 134 and 136. The UPS 100 also includes a primary power input 101, a bypass power input 102 and a power output 103. As with UPS 10B described above, the primary input 101 and the bypass input 102 may be coupled to separate sources of power or may be coupled to a common source of power through separate distribution components (i.e., relays, circuit breakers, fuses).

Figure 3:
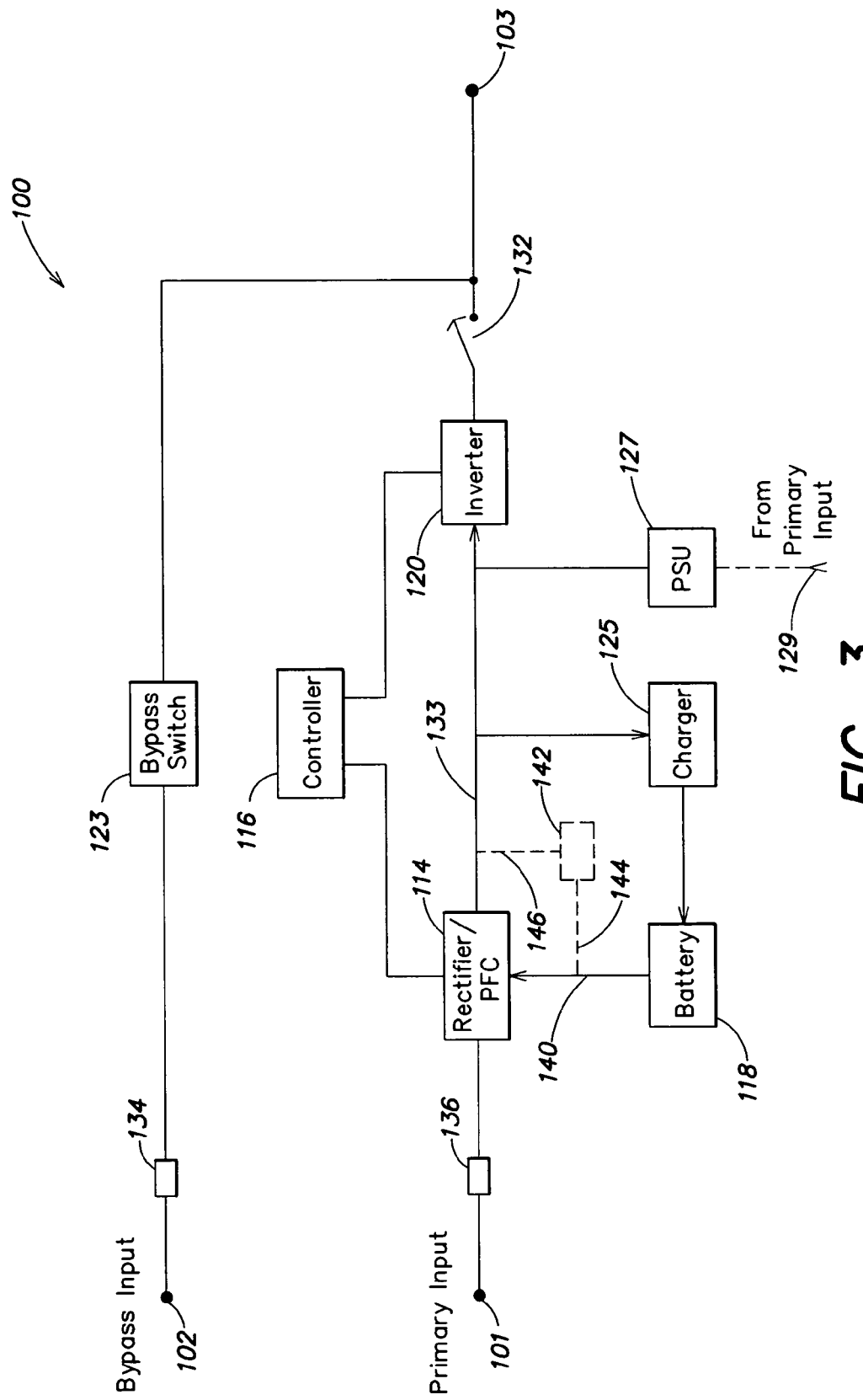
FIG. 3 is a functional block diagram of a UPS system in accordance with one embodiment of the invention.

In the embodiment shown in FIG. 3, the battery 118 is shown coupled to the rectifier/PFC circuit using a solid line 140, and is shown coupled to the DC bus 133 through a DC-DC converter 142 using dashed lines 144 and 146. The two connections of the battery indicate alternative connections of the battery in different embodiments of the invention, and in still another embodiment, the battery may be coupled to the DC bus 133 without the use of a DC-DC converter. In one embodiment, in which the battery is coupled to the rectifier/PFC circuit 114, and in which both a positive and negative battery is used (as well as positive and negative DC buses), the battery voltage may be boosted using the rectifier/PFC circuit as described in co-pending U.S. patent application Ser. No. 10/470,124, filed Jul. 25, 2003, titled Combined AC-DC to DC Converter, assigned to the assignee of the present application and incorporated herein by reference. In this first embodiment, the battery has a fully charged voltage of 192 volts (or −192 volts for the negative battery) and the voltage of the DC bus is 225 volts (and −225 for the negative bus). In another embodiment in which the battery is coupled to the DC bus 133 using the DC-DC converter 142, the battery may have a different voltage and the DC-DC converter can convert the DC battery voltage to match the voltage of the DC bus. In the embodiment shown in FIG. 3 only one battery is shown, however, in different embodiments, the battery 118 may be implemented using a combination of batteries coupled in parallel and/or in series to provide the voltage and capacity necessary for a given implementation.

The controller 116 is used to provide monitoring and control of components of the UPS 100. In FIG. 3, the controller 116 is shown as coupled only to the rectifier/PFC circuit 114 and the inverter 120, however, in different embodiments, the controller 116 may be coupled to all major components of the UPS 100 and may also be coupled to numerous sensing devices to monitor operational parameters of the UPS 100. The PSU 127 is coupled to the DC bus 133 and in one embodiment receives DC power from the bus and provides regulated output voltages to operate fans contactor coils and control boards. As shown in FIG. 3, the PSU 127 may also couple to the primary power input through input 129, bypassing contactor 136. In one embodiment, in which the PSU 127 couples to the primary input, the connection for the PSU is made after input EMI filtering and surge protection, and rectification diodes and current limiting resistors (not shown) are used to couple the PSU to the primary power input.

The contactors 134 and 136 provide isolation and back-feed protection between the UPS 100 and respectively the primary input 101 and the bypass input 102.

In a normal mode of operation of the UPS 100, AC power at the power input is passed through contactor 136 and rectified and power factor corrected in the rectifier/PFC circuit 114 to provide DC power to the DC bus. The inverter 120 receives the DC power and provides regulated AC power at the power output 103 through inverter relay 132. In the normal mode of operation, battery 118 is charged from the DC bus using a battery charger 125.

In battery mode of operation, contactor 136 (as well as contactor 134) is in an open position, and DC voltage is supplied from the battery to the DC bus 133 through either rectifier/PFC circuit 114 or through DC-DC converter 142. The inverter converts the DC voltage on the bus to AC voltage and provides output AC voltage to a load coupled to output 103. In the normal mode of operation and in the battery mode of operation, the inverter switch 132 is in the closed position. The switch 132 may be opened during a test mode of the UPS 100 to isolate the output from a load during a self-test.

The UPS 100 may also utilize a bypass mode of operation when input voltage is available at the bypass input 102 and not available at the primary input 101. In the bypass mode of operation, AC voltage at bypass input 102 is provided through contactor 134 and bypass switch 123 to the output 103. The bypass mode of operation may be used in place of the battery mode of operation to save battery life or may be used after battery mode when the batteries have become partially drained. In one embodiment, the UPS 100 may also include a mechanical bypass switch coupled directly between the bypass input 102 and the AC output 103. The mechanical bypass allows a user to completely bypass the UPS 100 upon failure of the UPS or to provide maintenance to the UPS.

The UPS 100 may be implemented as a single phase power supply, a three phase power supply or as a split phase supply and different embodiments may be designed to accommodate various input voltages as known to those skilled in the art. Further, the UPS 100 may be implemented as a modular, scalable UPS having multiple replaceable power modules and battery modules as described in U.S. Pat. No. 5,982,652 and in co-pending U.S. patent application Ser. No. 10/764,344, filed Jan. 23, 2004, titled Method and Apparatus for Providing Uninterruptible Power, both of which are assigned to the assignee of the present application and incorporated by reference herein. The UPS 100 is shown as a single DC bus UPS, however, other embodiments of the present invention may utilize dual DC buses having a positive and a negative bus and a common central point as described in U.S. patent application Ser. No. 10/470,124 discussed above.

As discussed above, one problem with typical dual mains uninterruptible power supplies is the inability in such supplies to charge batteries of the UPS while operating in bypass mode. In one aspect of the UPS 100 described above, as will now be described with reference to FIG. 4, batteries of the UPS may be charged while operating in bypass mode. As discussed above, upon loss of power at input 101 in the UPS 100, the UPS 100 may either enter a bypass mode in which bypass switch 123 is activated to provide output power for the load from a secondary source at input 102 or the UPS may operate in battery mode with DC power from the battery converted to AC through the inverter 120. In the aspect of the invention which will now be described, the inverter 120 is operated in a reverse/rectifier mode to maintain a constant voltage on the DC bus 133 when the UPS 100 is operating in bypass mode. The battery 118 can then be charged from the voltage on the DC bus using battery charger 125. As known to those skilled in the art, and as described in U.S. Pat. No. 5,302,858, which is incorporated herein by reference, by changing the control of an inverter, the components of the inverter may be used in a reverse mode as a rectifier.

Figure 4:
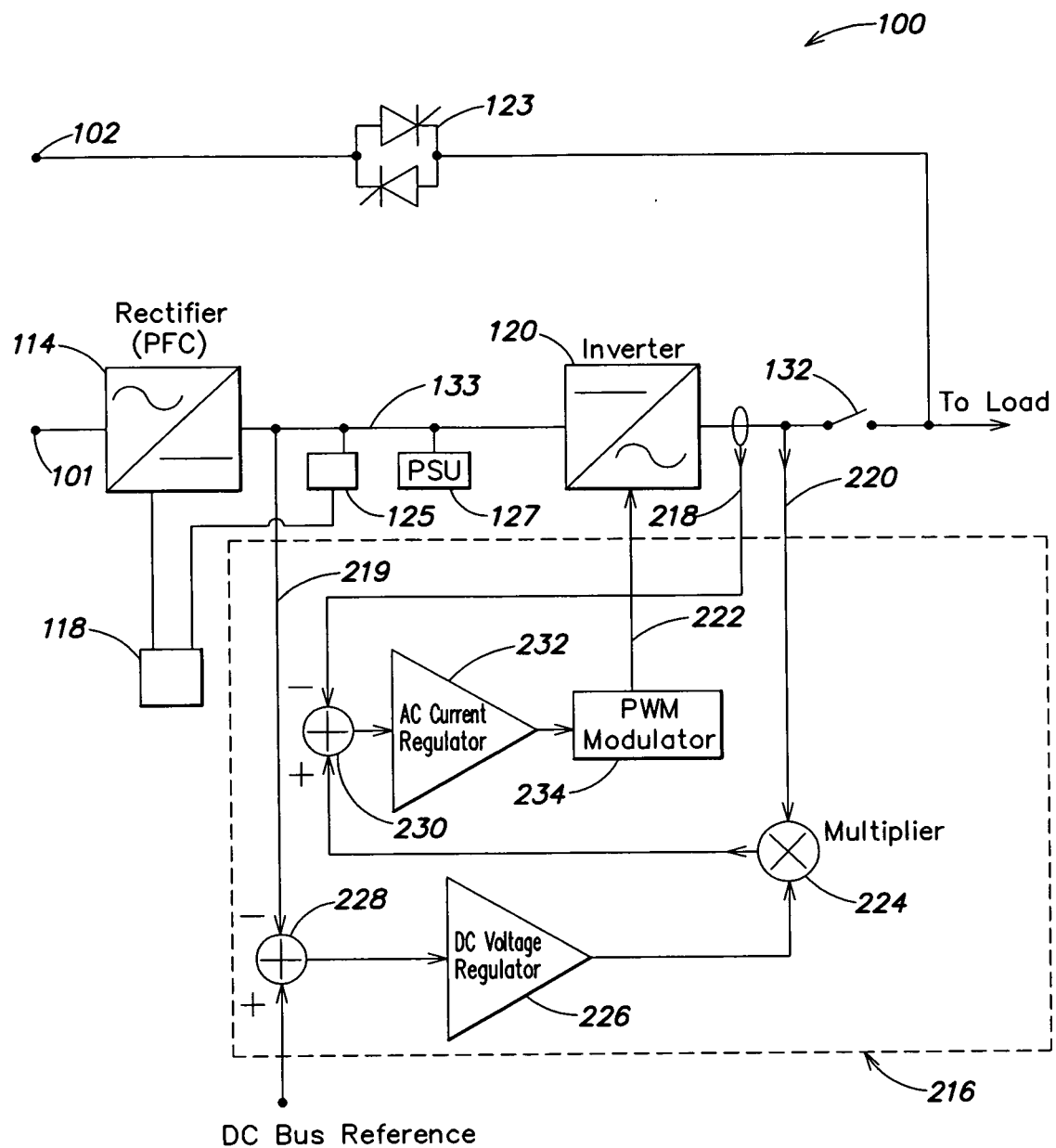
FIG. 4 is a functional block diagram of an inverter charging configuration that may be used in the UPS system of FIG. 3.

FIG. 4 provides a functional block diagram of portions of the UPS 100 along with portions of the control system utilized to implement the aspect of the invention in which batteries of the UPS 100 may be charged while the UPS 100 is operating in bypass mode. In the portion of the UPS 100 shown in FIG. 4, a control block 216 is coupled to the output of the inverter 120 to sense current at the output of the inverter using line 218 and to sense the voltage at the output of the inverter using sense line 220. The voltage of the DC bus 133 is also monitored by the control block using sense line 219. Control of the inverter is provided using control line 222. As understood by those skilled in the art, in different embodiments of the invention, control line 222 may be implemented using a number of distinct control lines to control transistors contained within the inverter 120, and the control lines used to control the inverter in bypass mode to charge the batteries may be the same as those used in other modes of the UPS 100 to provide an output AC voltage from the inverter.

The control block 216 includes a multiplier 224, a DC voltage regulator 226, combiners 228 and 230, an AC current regulator 232 and a pulse width modulator (PWM) 234. To provide DC voltage to the DC bus 133 in the bypass mode of operation, the inverter relay 132 is moved to the closed position, and AC current from the power source at the second input is rectified by the inverter under the control of control block 216. The control block 216 monitors the input current and voltage to the inverter/rectifier and the voltage of the DC bus and controls the inverter 120 to function as a rectifier to maintain the voltage on the DC bus at a desired value to provide a DC voltage to the battery charger and provide a DC voltage for the PSU. In the embodiment shown in FIG. 4, the battery is coupled to the rectifier/PFC circuit and is charged using a battery charger circuit 125, however, as described above, in other embodiments, the battery may be coupled directly to the DC bus or to the DC bus through a DC-DC converter. When coupled directly to the DC bus, an external battery charging circuit may not be needed.

The UPS 100 utilizes current control to control operation of the inverter 120 in the rectifier mode. An inner current control loop that includes a comparator 230, the current regulator 232 and the PWM modulator 234 provides control signals to the inverter to control current through the inverter. In one embodiment, peak current control is used with a fixed PWM frequency of 20 kHz. However, in other embodiments, average current control may be used and also the PWM frequency may be free-running. The inner current control loop uses the comparator 230 to compare the actual measured current by a current sensor with the output of the multiplier 224, so that the current is controlled to follow the output of the multiplier. The multiplier 224 has a first input coupled to the output of the inverter and a second input coupled to the output of a second comparator 228, which provides a signal indicative of a difference between the DC bus voltage and a DC bus reference voltage. The output signal of the multiplier is in phase with the voltage at the bypass input and has an amplitude based on the voltage level of the DC bus. The AC current regulator 232 and the DC voltage regulator 226 act as gain stages that buffer the control signals to provide appropriate signal levels for the inputs of the PWM modulator 234 and the multiplier 224.

Using the approach described above, the amplitude of the current drawn through the rectifier is based on the voltage level of the DC bus, and the phase of the current drawn by the inverter is in phase with the input voltage, so that unity power factor is obtained, and the voltage of the DC bus can be maintained at a constant level even in the presence of voltage swings at the bypass input.

In an alternate embodiment, a reference sine generator may be used in place of the DC bus reference, with the sine generator phase-locked to the voltage at the bypass input using a phase locked loop. In this embodiment, the multiplier 224 would not be present.

In one embodiment, in which digital control of the inverter is used (in both inverter and rectifier modes), the voltage of the DC bus 133 can be maintained, and accordingly battery 118 may be charged, in bypass mode without any additional components being added to the system. In this embodiment, the functions provided by control block 216 may be implemented using control algorithms in firmware of the controller 116. As known to those skilled in the art, these algorithms are similar to those used to operate the inverter 120 in inverter mode. In other embodiments, analog inverter control may be used, and in these embodiments, functions of control block 216 may require additional control circuits. In one embodiment, the inverter is implemented using a four-quadrant inverter.

The aspect of the present invention discussed above directed to the use of an inverter as a rectifier in bypass mode is also applicable to embodiments of the invention that use both a positive DC bus and a negative DC bus with a common center point. In such an implementation, individual control loops may be used for the positive and negative voltages, with the control loop for the positive bus being active during positive values of the reference current signal, and the control loop for the negative bus being active during negative values of the reference current signal. In one embodiment, in which both a positive DC bus and a negative DC bus are used, the inverter may be implemented using a three level inverter, such as those described in co-pending U.S. application Ser. No. 10/680,278, titled Three Level Inverter, filed Oct. 7, 2003, incorporated herein by reference.

In UPSs, such as UPS 100 that have an internal power supply unit (PSU 127) powered from the internal DC bus, embodiments of the invention provide additional benefits. It is desirable to power an internal PSU from a regulated DC bus rather than from a loosely regulated AC input, as it allows the PSU to be implemented as a DC-DC converter as opposed to an AC-DC power supply that requires input filtering, EMI control and input rectifiers. In the embodiment of the invention described above, since the DC bus is maintained at its proper voltage level in bypass mode using the inverter as a rectifier, the PSU 127 can be powered on in bypass mode without draining battery 118. With the PSU powered on in bypass mode, various devices within the UPS 100, such as fans, control boards, contactor coils and a display can be operated, in addition to the battery charger, while in bypass mode.

Figure 5:
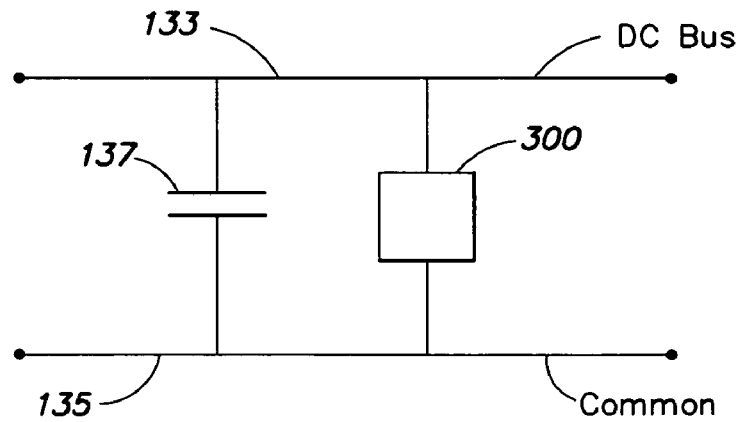
FIG. 5 is a diagram of a capacitor and capacitor discharge circuit that may be used in the UPS system of FIG. 3.

In one embodiment of the UPS 100, as shown in FIG. 5, one or more large DC capacitors 137 are coupled between the DC bus 133 and the common point for the DC bus 135 to assist in maintaining the DC voltage of the bus constant. In one embodiment used with a 15 kVA UPS having a dual +/−225 volt DC bus, a number of capacitors totaling 12,000 uF are used for the DC capacitor 137. In the embodiment shown in FIG. 5, a discharge circuit 300 is coupled across the capacitor 137 to discharge the capacitor after power is removed from the UPS in accordance with safety requirements. Typical safety requirements from, for example, Underwriter's Laboratory (UL) and the International Electrotechnical Commission (IEC), require that the voltage across the capacitor 137 be reduced to a safe level (i.e., 40 VDC) in a specified period of time (i.e., five minutes).

In typical UPSs, to meet these safety requirements, either a passive or an active discharge circuit is used. Typical passive circuits use resistors as discharging devices in parallel with the capacitor to be discharged. The use of resistors is often undesirable as these resistors draw maximum power at normal operating conditions (full voltage across the capacitor), and the discharge effect of the resistors drops as the voltage across the capacitor drops. Also, the use of resistors creates unwanted power losses. Active discharge circuits have an advantage over passive circuits as they are typically designed to draw constant power in discharge mode rather than follow the square of the voltage across the capacitors as with resistive discharge circuits. Active discharge circuits typically use a semiconductor device, such as a MOSFET transistor, however, these transistors when used in discharge applications typically require large heat sinks to be used. Active discharge circuits that use transistors that activate resistor discharging when power is turned off have also been used, but these devices still suffer from some of the disadvantages of using resistors, and often require complex activation circuits.

In one embodiment of the present invention the discharge control circuit 300 is implemented using a continuously active circuit that draws less power than typical passive resistor discharge circuits, and the power draw of the discharge device remains substantially constant over a large voltage range. The use of a continuously active circuit in embodiments of the invention allows the discharge circuit to operate without the need for external control circuits that activate the discharge circuit when power to the UPS is removed.

Figure 6:
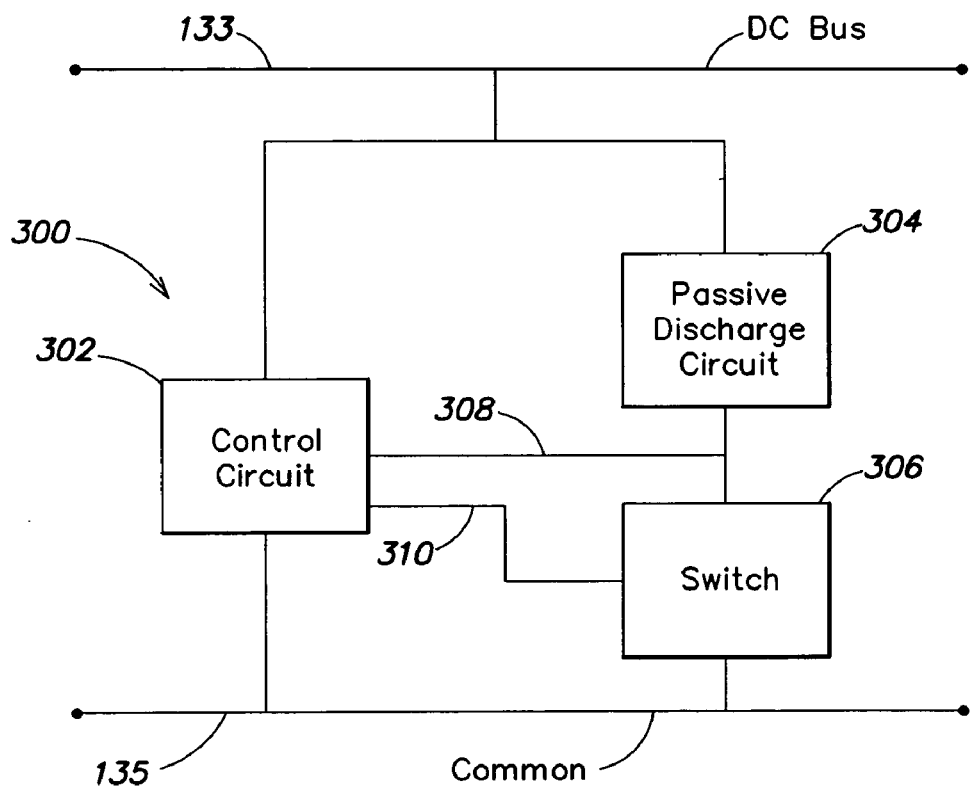
FIG. 6 is a functional block diagram of the capacitor discharge circuit of FIG. 5.

A functional block diagram of the discharge control circuit 300 in accordance with one embodiment is shown in FIG. 6. The discharge control circuit includes a control circuit 302, a passive discharge circuit 304 and a controlled switch 306. The control circuit 302 is coupled between the DC bus 133 and the common line 135, and the passive discharge circuit 304 and the switch 306 are coupled in series between the DC bus and the common line. The control circuit has a control input line 308 coupled between the passive discharge circuit and the switch and has a control output line coupled to the switch to control the state of the switch. The control circuit 302 detects the DC bus voltage and controls the switch 306 using control line 310 to control current flow through the passive discharge circuit. The control input 308 is used in one embodiment to detect when the switch 306 has been turned off to reset a timing circuit in the control circuit 320.

Figure 7A:
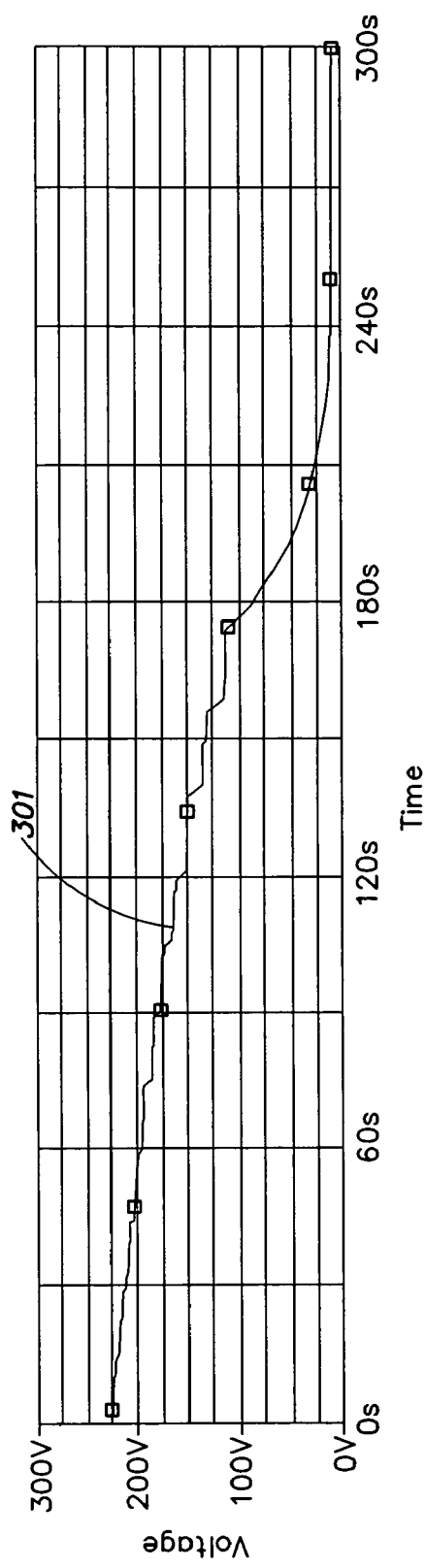
FIGS. 7A and 7B show waveforms of signals used in the capacitor discharge circuit of FIG. 6.
Figure 7B:
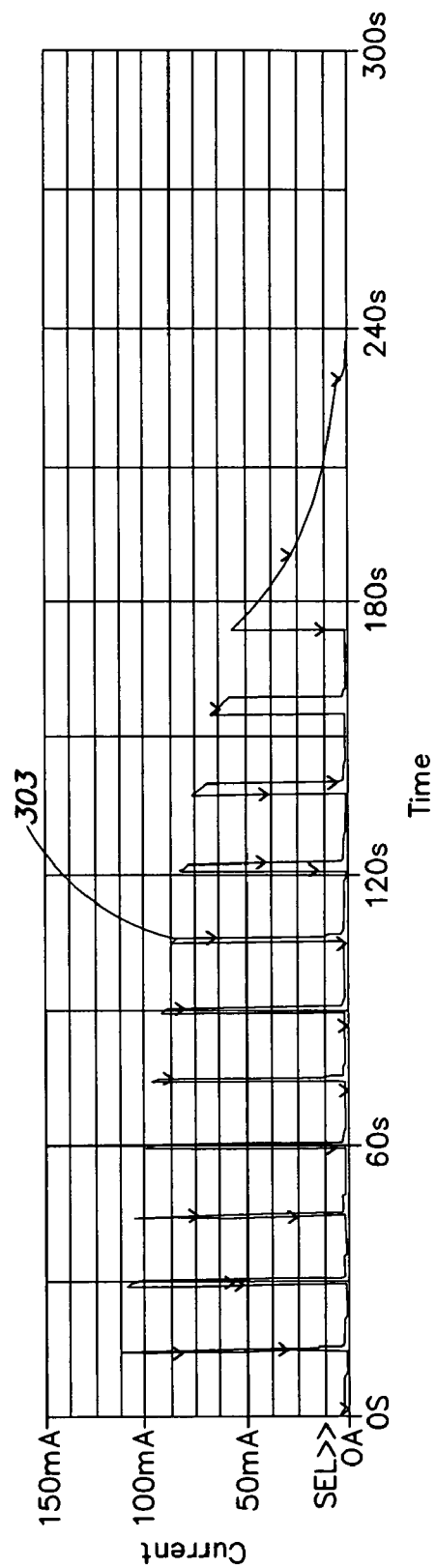

In general, the control circuit 302 lowers the duty cycle for the "on" time of the switch for higher DC bus voltages and increases the duty cycle for lower DC bus voltages. In one embodiment, in which the DC bus voltage is designed to operate at 225 VDC with a DC capacitance value of 12,000 uF, the control circuit 302 controls the switch to operate at a switching frequency of approximately 200 Hz. In this embodiment, in a power off condition, once the voltage of the DC bus drops to approximately 120 VDC, the control circuit controls the switch to stay on. FIGS. 7A and 7B show respectively the voltage across the DC bus, line 301 in FIG. 7A, and the current through the discharge circuit, line 303 in FIG. 7B, for the example described above after power to the UPS 100 has been turned off. For the example shown in FIGS. 7A and 7B, the frequency has been reduced to 0.1 Hz for reasons of clarity. The time axis of FIG. 7B is a common time axis for both FIGS. 7A and 7B. As shown in FIG. 7A, the voltage across the capacitor decreases during each of the current pulses through the discharge circuit, and once the discharge voltage reaches 120 VDC, the discharge circuit stays on with both the voltage and current decreasing with time. In other embodiments, depending on the values of timing components, such as capacitors and resistors in the discharge circuit, the pulse frequency may be a few hundred Hz, or as high as several kHz.

Figure 8:
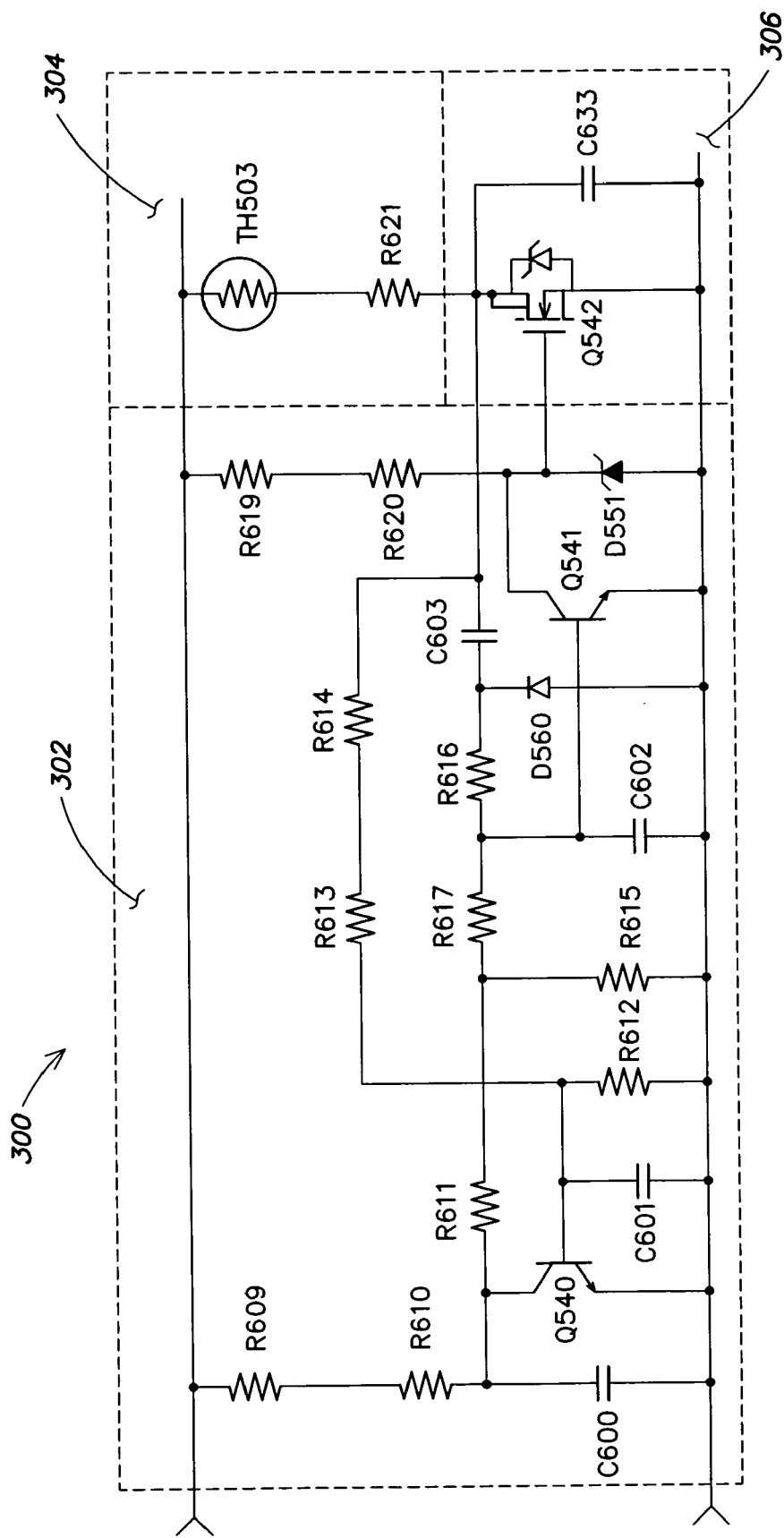
FIG. 8 is a schematic diagram of the capacitor discharge circuit of FIG. 6.

The detailed design of the discharge circuit 300 that operates in accordance with principles described above will now be described with reference to FIG. 8, which shows a schematic diagram for each of the functional blocks 302, 304 and 306 of the discharge circuit 300. Component values for the components shown in FIG. 8 are provided in Table 1.

TABLE 1

Component Values for Discharge Circuit 300

|  | Ref. No. | Value (ohms) | Power Rating (watts) | Tolerance (%) |
|---|---|---|---|---|
| Resistors | R609 | 100.0K | 1/4 W | 1 |
|  | R610 | 100.0K | 1/4 W | 1 |
|  | R611 | 100.0K | 1/4 W | 1 |
|  | R612 | 220K | 1/4 W | 1 |
|  | R613 | 220K | 1/4 W | 5 |
|  | R614 | 220K | 1/4 W | 5 |
|  | R615 | 3.32K | 1/4 W | 1 |
|  | R617 | 100.0K | 1/4 W | 1 |
|  | R618 | 100.0K | 1/4 W | 1 |
|  | R619 | 220K | 1/4 W | 5 |
|  | R620 | 220K | 1/4 W | 5 |
|  | R621 | 1K | 3 W | 5 |

|  | Ref. No. | Value (farads) | Voltage (volts) | Tolerance (%) |
|---|---|---|---|---|
| Capacitors | C600 | 220 PF | 500 V | 10 |
|  | C601 | 2.2 NF | 50 V | 10 |
|  | C602 | 2.2 NF | 50 V | 10 |
|  | C603 | 4.7 NF | 500 V | 10 |
|  | C633 | 68 PF | 500 V | 10 |

|  | Ref. No. | Voltage (volts) |
|---|---|---|
| Diodes | D551 | 15 V |
|  | D560 | 300 V |

|  | Ref. No. | Type | Part No. |
|---|---|---|---|
| Transistors | Q540 | NPN | BTA 42 |
|  | Q541 | NPN | SMBT3904 |
|  | Q542 | MOSFET | STN1NB80 |

|  | Ref. No. | Type | Value (ohms) |
|---|---|---|---|
| Thermistor | TH503 | PTC | 1K |

The passive discharge circuit 304 includes a thermistor TH503 and a resistor R621 coupled in series between the DC bus and the input to the controlled switch 306. The thermistor TH503 is a positive temperature coefficient device whose resistance will increase with an increase in temperature. The use of the thermistor in the passive discharge circuit provides added safety by increasing resistance through the discharge circuit when temperature rises, which may indicate a fault in the circuit. In other embodiments, the passive discharge circuit may include only one resistor or some other combination of passive resistance devices.

The controlled switch 306 includes a transistor Q542 coupled in parallel with a capacitor C633 between the output of the passive discharge circuit and the common line. The control circuit 302 includes a number of devices that operate together to turn on and off the controlled switch based on the voltage of the DC bus. To simplify the explanation of the operation of the control circuit 302, the control circuit may be considered as having a turn-off portion that turns the controlled switch off and a turn-on portion that turns the controlled switch on, although the two portions of the control circuit do interact in operation to perform the turn-on and turn-off functions. The turn-off portion includes resistors R609, R610, R611, R615, R617, R618, transistor Q541, capacitors C600, C602, and C603 and diodes D560 and D551. The turn-on portion includes resistors R612, R613, R614, R619, R620, capacitor C601 and transistor Q540.

The operation of the discharge circuit 300 will now be described in detail starting from a first state in which the DC bus voltage is at its full voltage value, with transistor Q540 just having turned off and with transistor Q542 just having turned on, allowing current to flow through thermistor TH503 and resistor R621. At this first state, the voltage across capacitor C600 is initially zero, but starts increasing as capacitor C600 charges through resistors R609 and R610. The voltage at the base of transistor Q541 increases with the voltage across C600, and transistor Q541 will turn on once this voltage exceeds the transistor's threshold voltage. When transistor Q541 turns on, transistor Q542 turns off.

The transition from on to off of transistor Q542 generates a current through capacitor C603, which ensures a fast turn-on of transistor Q541, and at the same time results in a minimum off time for transistor Q542. At about the same time, transistor Q540 is turned on as current flows through resistors R613 and R614 and charges capacitor C601. When transistor Q540 turns on, capacitor C600 is discharged along with capacitors C602 and C603. Transistor Q541 will then turn off turning on transistor Q542, and returning the discharge circuit to the first state.

In the control circuit 302 described above, the timing for controlling the controlled switch 306 is defined by the voltage on capacitors C600 and C603, which are charged from the voltage on the DC bus, so that the timing of the circuit is dependent on the voltage of the DC bus. In the embodiment shown in FIG. 8, once the voltage of the DC bus reaches approximately 80 VDC, the voltage at the base of transistor Q541 does not reach a level high enough to turn on transistor Q541, and accordingly, for voltages below 80 VDC, the discharge circuit 300 operates as a passive discharge circuit.

Specific values of components and circuit arrangements are provided for the exemplary embodiment shown in FIG. 8. As understood by those skilled in the art, embodiments of the invention may be implemented using other circuits with other valued components. In addition, the values of components provided may be changed to adapt the discharge circuit to accommodate other DC bus voltages.

In one embodiment of the invention, the discharge circuit 300 remains active during operation of the UPS and accordingly does not require a turn-on circuit or device that turns on the discharge circuit when the UPS is powered down. Nonetheless, embodiments of the present invention may also be used with turn-on circuits and devices, such that the discharge circuit is only active once the UPS is powered down to discharge the DC capacitors.

In some instances, regulatory agencies require discharge circuits that have active components to include redundant circuits, such that the discharge circuits will still function when one or more active components fail. In one embodiment of the invention, to satisfy this requirement, two discharge circuits, like discharge circuit 300 may be used in parallel. Further, as discussed above, some UPSs utilize a dual DC bus configuration having positive and negative DC buses with a shared common bus. For UPSs of this type, large DC capacitors may be used for each of the DC buses, and a separate discharge circuit 300 may be used with each of the buses.

Discharge circuits of embodiments of the invention are described for use with uninterruptible power supplies, however, as understood by those skilled in the art, discharge circuits of the present invention may be used in other types of power supplies and other types of electronic equipment to provide discharge of capacitors or other electrical devices.

As discussed above, the contactors 134 and 136 of the UPS 100 are used to provide isolation and backfeed protection. Typical contactors have a coil that receives a control voltage, the application of which pulls the contactor from an open, OFF state to a closed, ON state. Depending on the contactor type, the coil may be designed to operate with either AC or DC. AC contactors at times provide a simple solution in that the AC voltage on the input mains that the contactor is controlling can be used to power the coil. For devices, like UPSs, that may operate over wide ranges of input voltages, the use of the AC input voltage to power the coil may be undesirable as the coil would be required to operate over the wide range of input voltages, which may be difficult to implement.

When DC coils are used in contactors of a UPS, DC power is generally derived from an internal power supply unit, such as power supply 127 of UPS 100. In such applications, the power supply may be coupled directly to the mains (rather than through the contactor), and typical power requirements allow such a power supply to draw up to 140 watts directly from the AC line. One problem with driving a coil from a DC power supply is that the coils associated with contactors typically have a very high coil inrush power required to initially turn the contactor on, while the steady state power is typically much less. For typical three-phase 120 ampere contactors, the inrush power may be as high as 200 watts peak when the coil is energized, but drops to approximately 5 watts once the contactor is in steady state. The high coil inrush power often requires the DC power supply to be much larger than necessary for the average power consumption of the system or alternatively to require an output capacitor in the power supply to be extremely large such as 100,000 microfarads.

Figure 9:
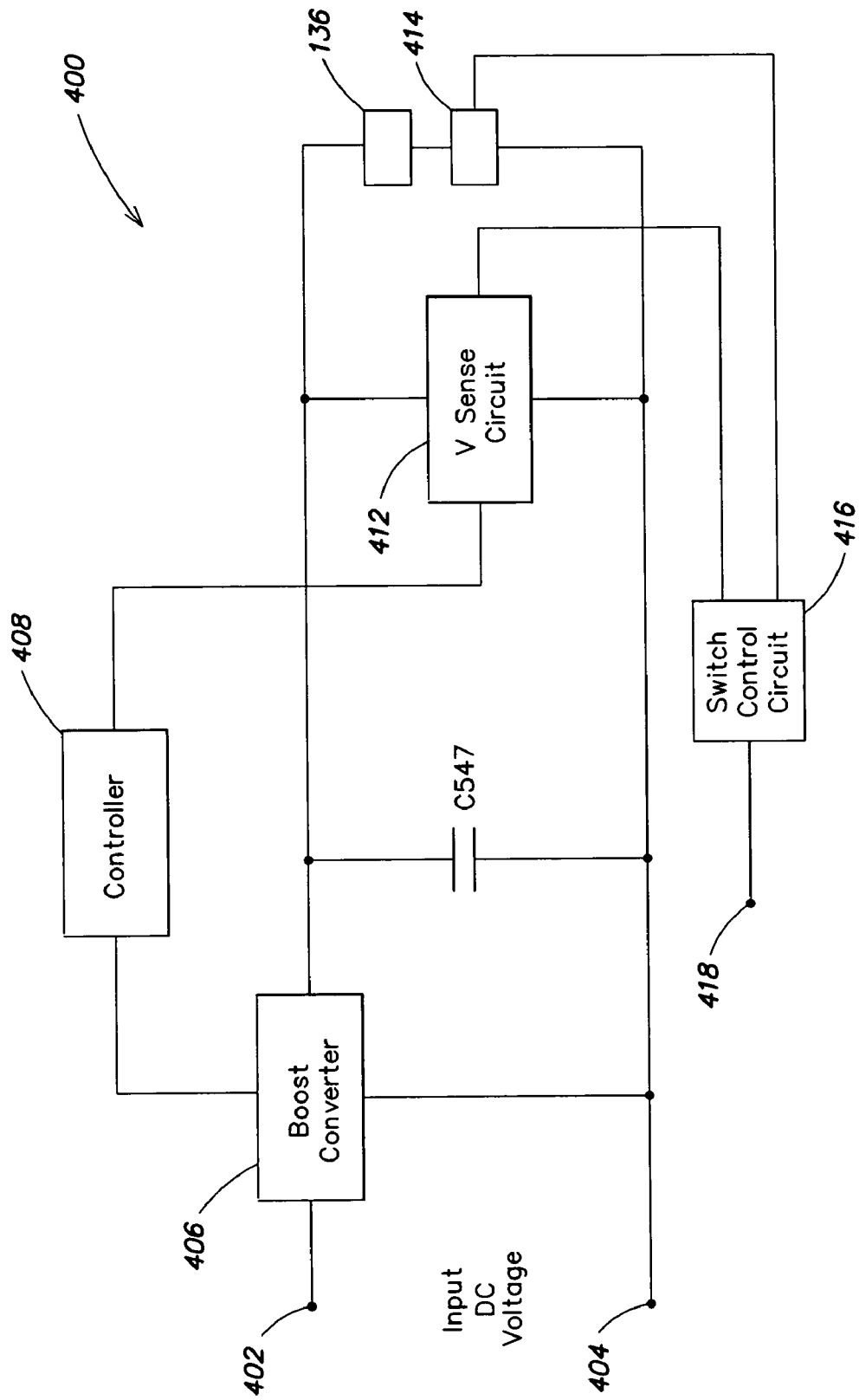
FIG. 9 is a functional block diagram of a contactor control circuit that may be used in the power supply of FIG. 3.

One embodiment of the present invention, for use with a contactor having a nominal coil voltage of 24 volts, which will now be described with reference to FIG. 9, allows the use of a DC power supply in the UPS 100 to drive the coils of contactors without the need for an oversized power supply or oversized capacitor in the power supply. FIG. 9 shows a functional block diagram of a drive circuit 400 coupled to contactor 136 of UPS 100. Similar drive circuits may be used to drive contactor 134. For simplicity, in FIG. 9, the connection of contactor 136 to the AC mains is not shown. The drive circuit 400 includes inputs 402 and 404 that couple to a DC power supply, which in one embodiment may be power supply 127. The drive circuit 400 also includes a boost converter 406, a controller 408, a capacitor C547, a voltage sense circuit 412, a switch 414, a switch control circuit 416, and a control input 418.

The operation of the drive circuit 400 is as follows. The boost converter receives input voltage at inputs 402 and 404 and generates a boosted voltage across capacitor C547. The voltage at capacitor C547 is applied across contactor 136, when switch 414 is turned on. The state of switch 414 is controlled by the switch control circuit 416 which is responsive to an input control signal 418. Input control signal 418 is generated in one embodiment by the UPS controller 116, however, in other embodiments, the input control signal may be generated by a logic circuit when, for example, the UPS 100 is switched from a standby mode to a power-on mode. In addition, in one embodiment, control of contactor 134 is provided by a separate controller that also controls the bypass switch 123.

Controller 408 monitors the voltage across capacitor C547 and controls the boost converter 406 to provide a predetermined voltage across the capacitor. The output of the boost converter is controlled to have one of two different output voltages depending on the state of the contactor 136. In one embodiment, the voltage across capacitor C547 is controlled to be approximately 55 volts before the contactor 136 is activated and controlled to be approximately 24 volts when the contactor is turned on. In the embodiment of FIG. 9, the switch control circuit provides an input voltage to the voltage sense circuit 412 when an activation signal is sent to switch 414. The controller 408 detects the additional voltage at voltage sense circuit 412 and thereafter controls the voltage across the capacitor to be 24 volts. The energy released when the voltage across the capacitor C547 is dropped from 55 volts to 24 volts is sufficient to energize the coil of the contactor 136 to pull in the contactor completely and allow power to flow from the primary mains into the UPS 100. Once the contactor is closed, the boost converter can provide sufficient power to the contactor to keep the contactor closed. The contactor can be opened (turned off) by opening the switch 414. In one embodiment, once the contactor is opened, it cannot be closed again until the capacitor C547 is fully charged, which may take up to two seconds.

A more detailed schematic of the drive circuit 400 in accordance with one embodiment of the invention will now be described with reference to FIG. 10A and FIG. 10B. Table 2 includes a description of components that may be used in the circuit diagrams of FIGS. 10A and 10B.

TABLE 2

Figure 10A:
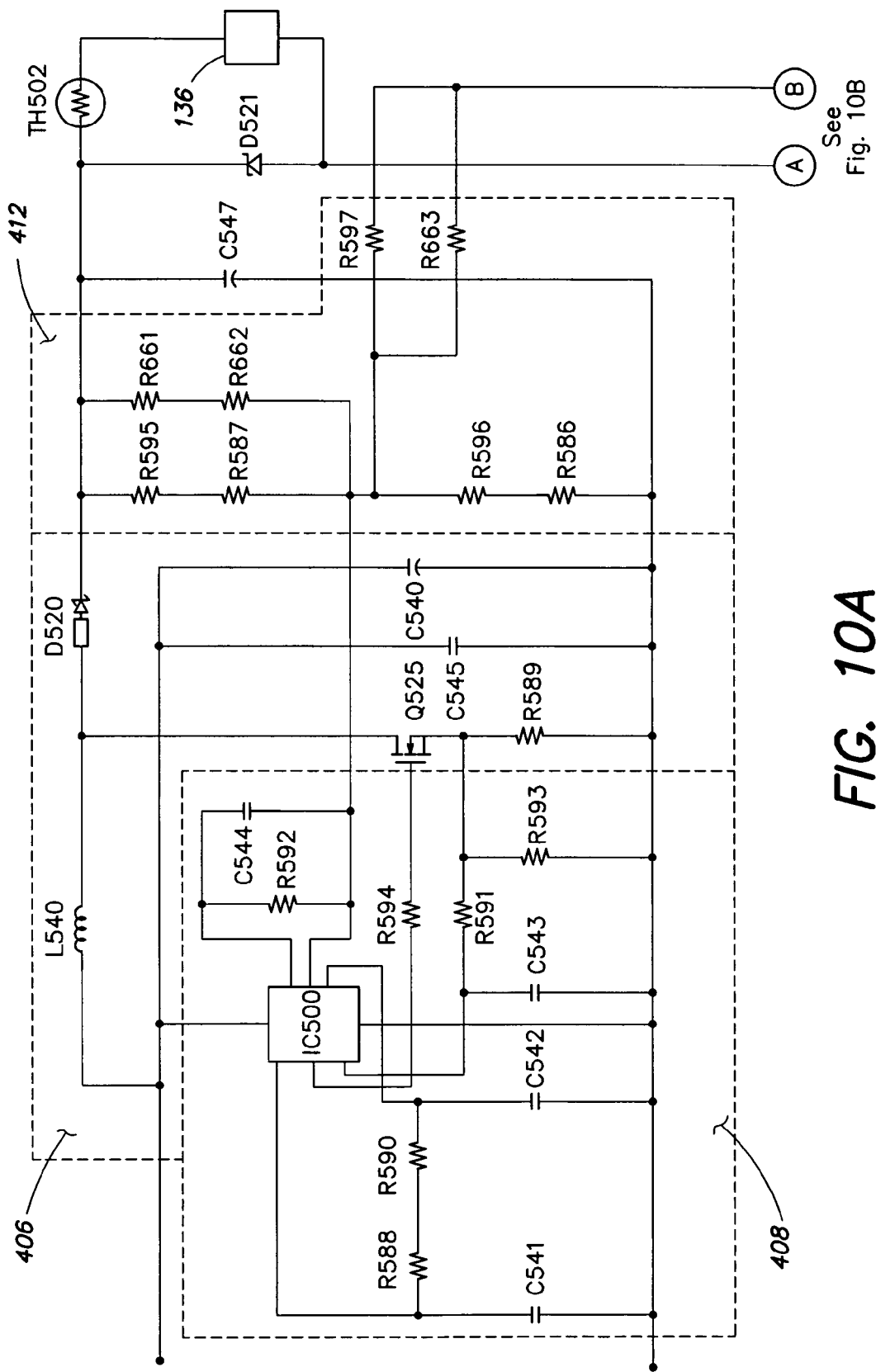
FIGS. 10A and 10B are schematic diagrams of the contactor control circuit of FIG. 9.
Figure 10B:
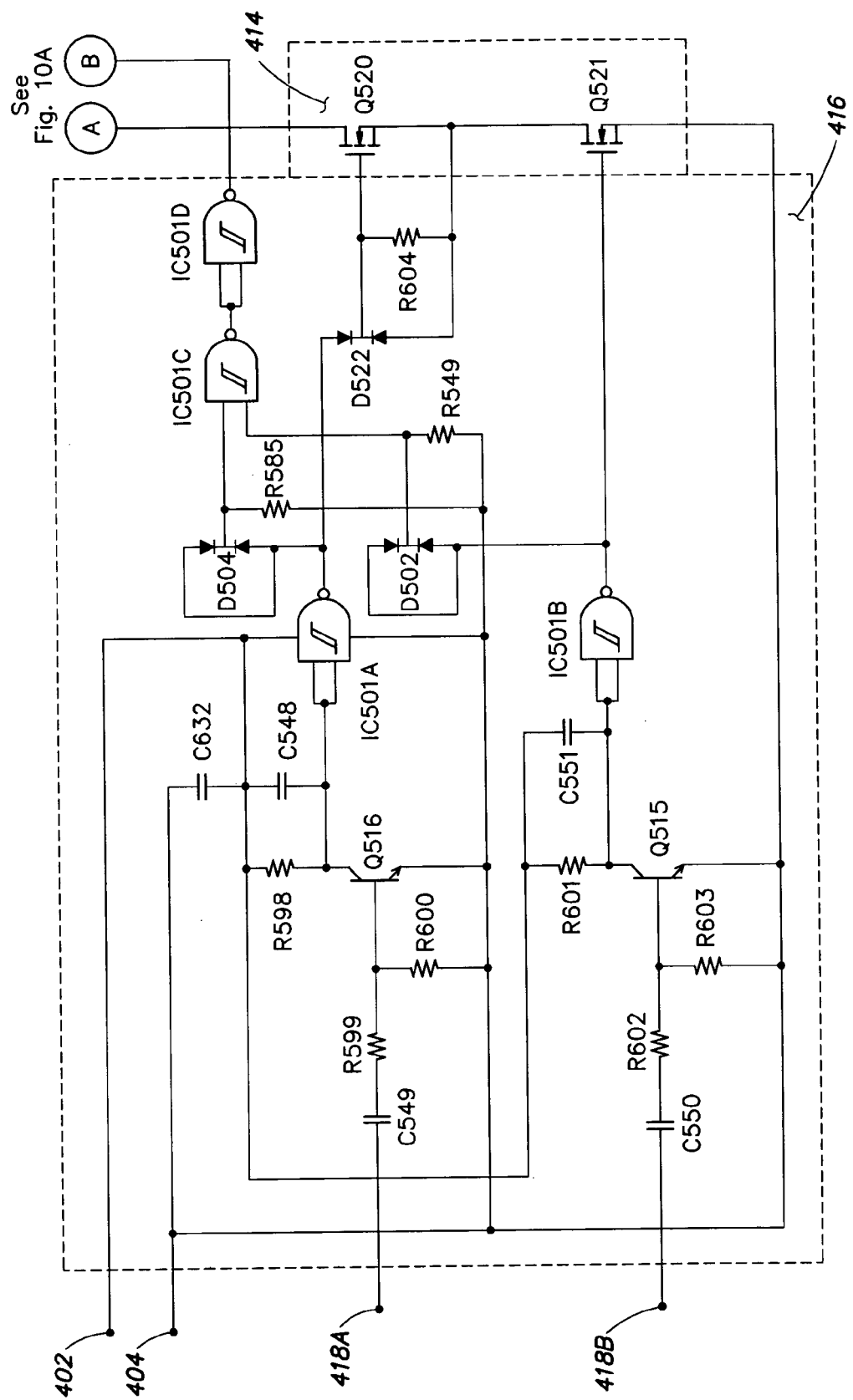

Component Values For Circuits of FIGS. 10A and 10B

| | Ref. No. | Value (ohms) | Power Rating (watts) | Tolerance (%) |
|---|---|---|---|---|
| Resistors | R549 | 10K | 1/4W | 5 |
| | R585 | 10K | 1/4W | 5 |
| | R586 | 5.90K | 1/4W | 1 |
| | R587 | 200K | 1/4W | 1 |
| | R588 | 10K | 1/4W | 5 |
| | R589 | 2.7 ohms | 1/4W | 5 |
| | R590 | 10K | 1/4W | 5 |
| | R591 | 1K | 1/4W | 5 |
| | R592 | 100K | 1/4W | 5 |
| | R593 | 2.7 ohms | 1/4W | 5 |
| | R594 | 10 ohms | 1/4W | 5 |
| | R595 | 200K | 1/4W | 1 |
| | R596 | 5.11K | 1/4W | 1 |
| | R597 | 200K | 1/4W | 1 |
| | R598 | 100K | 1/4W | 5 |
| | R599 | 10K | 1/4W | 5 |
| | R600 | 10K | 1/4W | 5 |
| | R601 | 100K | 1/4W | 5 |
| | R602 | 10K | 1/4W | 5 |
| | R603 | 10K | 1/4W | 5 |
| | R604 | 10K | 1/4W | 5 |
| | R661 | 200K | 1/4W | 1 |
| | R662 | 200K | 1/4W | 1 |
| | R663 | 200K | 1/4W | 1 |

| | Ref. No. | Value (farads) | Voltage (volts) | Tolerance (%) |
|---|---|---|---|---|
| Capacitors | C540 | 100 uF | 50 V | 20 |
| | C541 | 100 nF | 50 V | 10 |

TABLE 2-continued

Component Values For Circuits of FIGS. 10A and 10B

| | C542 | 1 nF | 50 V | 10 |
|---|---|---|---|---|
| | C543 | 100 pF | 50 V | 10 |
| | C544 | 1 nF | 50 V | 10 |
| | C545 | 100 nF | 50 V | 10 |
| | C547 | 4700 uF | 63 V | 20 |
| | C548 | 47 nF | 50 V | 10 |
| | C549 | 47 nF | 50 V | 10 |
| | C550 | 47 nF | 50 V | 10 |
| | C551 | 47 nF | 50 V | 10 |
| | C632 | 100 nF | 50 V | 10 |

| | Ref. No. | Voltage (volts) |
|---|---|---|
| Diodes | D504 | 75 V |
| | D502 | 75 V |
| | D520 | 100 V |
| | D521 | 200 V |
| | D522 | 75 V |

| | Ref. No. | Inductance (henries) | Current (amperes) |
|---|---|---|---|
| Inductor | L540 | 68 uH | 1.75 A |

| | Ref. No. | Type | Part No. |
|---|---|---|---|
| Transistors | Q515 | NPN | MMBT3904 |
| | Q516 | NPN | MMBT3904 |
| | Q520 | MOSFET | NTB52N10T4 |
| | Q521 | MOSFET | NTB52N10T4 |
| | Q525 | MOSFET | NTB52N10T4 |

| | Ref. No. | Type | Value (ohms) |
|---|---|---|---|
| Thermistor | TH502 | PTC | 0.25 ohms |

| | Ref. No. | Part No. |
|---|---|---|
| Integrated Circuit | IC500 | UC3843 |
| | IC501 | CD4093 |

For the components shown in Table 2, transistors Q515 and Q516 are available from Fairchild Semiconductor of Wiltshere, UK, transistors Q520, Q521 and Q525 are available from ON Semiconductor of Phoenix, Ariz., and IC500 and IC501 are available from Texas Instruments of Niskayuna, N.Y.

As understood by those skilled in the art, embodiments of the invention are not limited to the particular arrangement of components shown in FIGS. 10A and 10B. FIG. 10A shows the boost converter 406, the controller 408, the voltage sense circuit 412, and the capacitor C547 in greater detail, while FIG. 10B shows the switch 414 and the switch control circuit 416 in greater detail. The boost converter includes a transistor Q525 that is coupled to a diode D520 and an inductor L540. In addition, the boost converter includes a resistor R589 that is used to measure and control the peak current through Q525 when the boost converter is operating. This ensures that the peak current build up in L540 during each switching cycle (when Q525 is on) only rises to a level that doesn't saturate L540 and is further acceptable for Q525. In FIG. 10A, the boost converter block also includes capacitors C545 and C540, which are used as filtering capacitors. A major portion of controller 408 is IC500. The controller also includes resistors R588, R590, R591, R592, R593 and R594 and capacitors C541, C542, C543, and C544 which are used to provide operational voltages to IC500 and control the operational state of IC500.

The voltage sense circuit 412 includes resistors R586, R587, R595, R596, R597 and R663. In the embodiment shown in FIG. 10A, the controller is configured to control transistor Q525 of the boost converter to maintain a constant voltage at the junction between resistors R587 and R596. Prior to the activation of the contactor, the switch control circuit provides a low voltage at point B, and as a result, the controller controls the voltage across capacitor C547 to be approximately 55 volts. Once the contactor has been activated, the switch control circuit provides a voltage of approximately 15 volts causing the controller to detect a higher voltage at the junction of resistors R587 and R596 and reduce the voltage across capacitor C547 to approximately 24 volts.

The circuit of FIG. 10A also includes a thermistor TH502 in series with the contactor 136 and a diode D521 coupled in parallel with the contactor. The thermistor has a positive temperature coefficient and is used as a protection device to limit the current to the contactor. Diode D521 prevents a reverse voltage spike from developing across the contactor when turned off to protect transistors Q520 and Q521.

As discussed above, FIG. 10B shows the switch 414 and the switch control circuit 416 of one embodiment of the drive circuit 400 in greater detail. The switch 414 includes two FET transistors Q520 and Q521 coupled in series between the contactor and ground. In the embodiments shown, two transistors are used in the switch circuit, and redundant circuits are used in the switch control circuit 416 to meet redundancy requirements of UL. In operation, both transistors Q520 and Q521 are turned on to turn the contactor on and to keep it on.

The switch control circuit 416 receives input signals at 418A and 418B and provides output drive signals for FET transistors Q520 and Q521. In the embodiment shown, the switch control circuit is designed to turn on transistors Q520 and Q521 upon receipt of input pulse signals at inputs 418A and 418B. The signals at 418A and 418B may be the same signal generated from, for example, a field programmable gate array or from the controller 408. The signals at the two inputs may be generated from two different sources for redundancy purposes. In one embodiment, the switch circuit is designed to operate with a pulse signal having a frequency of 20 kHz and a duty cycle of 20%. The switch control circuit 400 includes four NAND gates IC501A, IC501B, IC501C and IC501D that in one embodiment are implemented on a common integrated circuit, identified as IC501 in Table 2. The switch also includes transistors Q515 and Q516, resistors R549, R585, R604, R598, R599, R600, R601, R602, R603 and R604, capacitors C548, C549, C550, C551 and C632, and diode pairs D502, D504 and D522.

In the switch control circuit, capacitor C632 is coupled across the input voltage lines 402 and 404 to steady the voltage to the switch control circuit. Capacitors C548, C549 along with resistors R598, R599 and R600 are used to bias transistor Q516 to provide a low signal to the input of gate IC501A when a pulse signal is received at input 418A. Similarly, capacitors C550, C551 along with resistors R601, R602 and R603 are used to bias transistor Q515 to provide a low signal to the input of gate IC501B when a pulse signal is received at input 418B. When the output of IC501A is high, transistor Q520 is turned on through diode pair D522 and resistor R604. When the output of IC501B is high, transistor Q521 is turned on. Diode D522 and resistor R604 are used to prevent the occurrence of an undesirably high gate voltage for transistor Q52. The output of IC501A is coupled to the first input of IC501C through diode pair D504 and resistor R585, and similarly, the output of IC501B is coupled to the second input of IC501C through diode pair D502 and resistor R549, such that the output of IC501C goes low when the outputs of both IC501A and IC501B are high. When the output of IC501C is low, then the output of IC501D is high providing an input voltage to the voltage sense circuit.

In the embodiment described above with respect to FIGS. 9, 10A and 10B, the energy released when the output capacitor C547 is discharged from 55 volts to 24 volts is sufficient for pulling in the contactor, without a large inrush current from the power supply feeding the control circuit 400. While the contactor remains on, the voltage is controlled at 24 volts as described above. If the contactor is turned off, then the voltage across capacitor C547 will charge back to 55 volts.

According to another aspect of the present invention, the UPS 100 may include a battery monitoring circuit that can monitor the status of one or a number of battery units that provide DC power to the UPS 100. The battery monitoring circuit may be incorporated into battery units that are internal to the UPS 100, such as battery 118 depicted in FIG. 3, or may be incorporated into battery units that are connected externally to the UPS, or both.

In accordance with one embodiment of the present invention, the battery monitoring circuit may monitor the number of battery units operatively connected to the UPS 100, the highest temperature of any of the battery units operatively connected to the UPS 100, whether a fuse (or circuit breaker) is blown (or tripped) in any of the externally (or internally) connected battery units, or each of the above. This information may be provided to the controller 116 to enable the controller to determine the size, for example, in Amp-hours, of the bank of battery units operatively connected to the UPS 100. From information concerning the size of the bank of batteries, the controller 116 may adjust run-time algorithms used by the UPS during battery mode operation or may adjust the charge current so as to stay below recommended levels of charge current per battery. The information concerning the highest temperature may also be provided to the controller 116 to enable the controller to adjust the charge voltage used to recharge the batteries within the battery units so as to prolong battery life and avoid thermal run-away during charging. These and other aspects of a battery monitoring circuit are now described with respect to FIGS. 11–12.

Figure 11A:
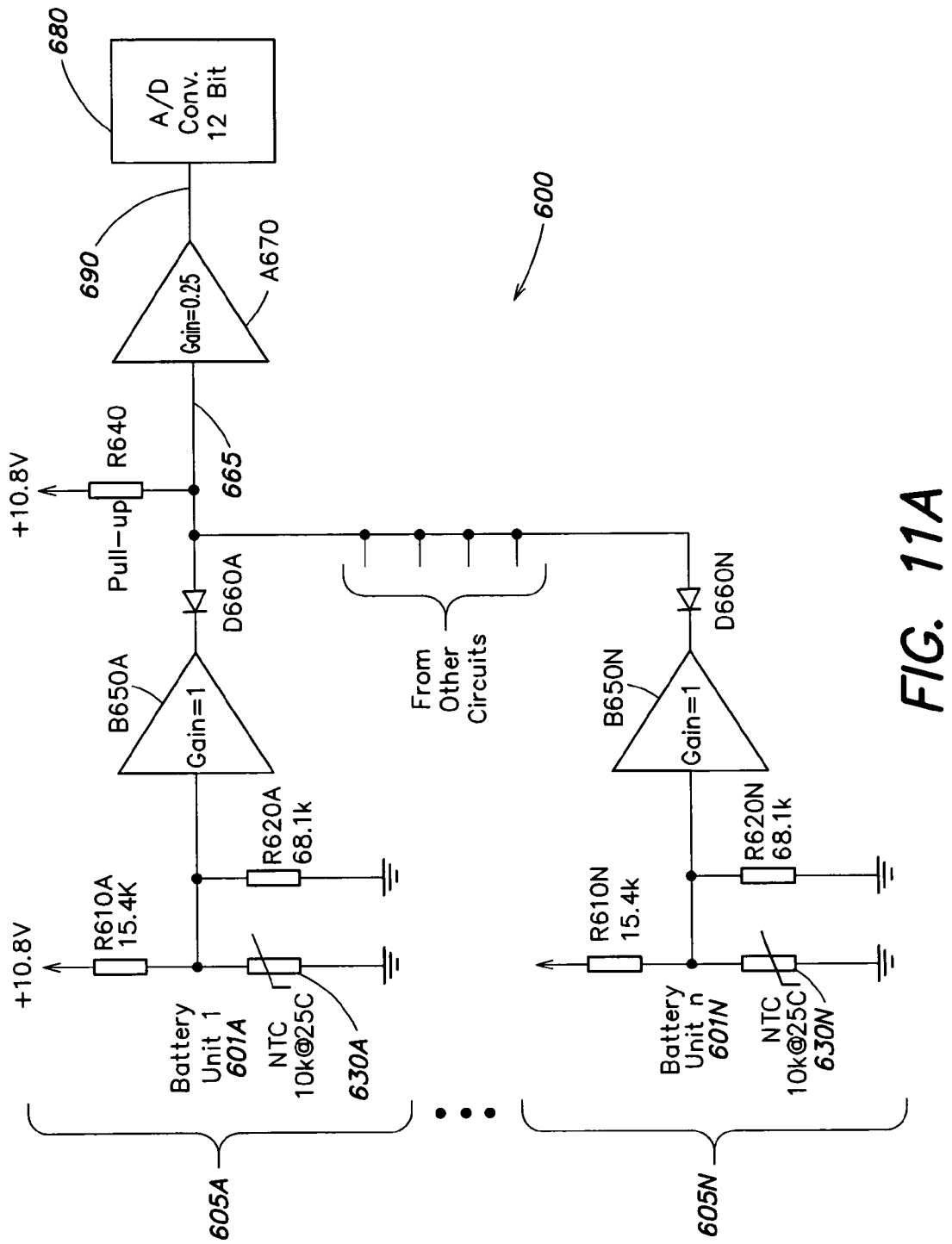
FIG. 11A is a schematic diagram of a battery monitoring circuit in accordance with one embodiment of the present invention.

FIG. 11A illustrates a generalized and simplified schematic diagram of a battery monitoring circuit 600 in accordance with one embodiment of the present invention. The battery monitoring circuit 600 may be used to monitor the temperature of battery units that are operatively connected to the UPS 100, whether those battery units are disposed within the UPS 100 or connected externally thereto. In accordance with one aspect of the present invention, the battery monitoring circuit 600 may detect the highest temperature of any of the battery units that are operatively connected to the UPS 100, and communicate that information, via an analog bus, to the controller 116. Advantageously, the analog bus may be shared by a plurality of individual battery units 601A–601N, some of which may be external to the UPS 100, and others that may be internal to the UPS 100 (e.g., battery 118 in FIG. 3).

As shown in FIG. 11A, the battery monitoring circuit 600 includes a plurality of individual battery unit monitoring circuits 605A–N, one for each battery unit 601A–601N that is operatively connected to the UPS 100. It should be appreciated that the battery 118 illustrated in FIG. 3 may also include one or more battery unit monitoring circuits that are similar to the battery monitoring circuit 605, as the present invention is not limited to the use of battery monitoring circuits on only external battery units. The output voltage of each of the individual battery units 601A–601N would typically be connected in parallel with the output voltage of battery 118. Each battery unit 601 would typically include a number of interconnected batteries (not shown) within each battery unit.

Each battery unit monitoring circuit 605 provides an analog output signal that is indicative of the highest temperature within the respective battery unit 601. The analog output signals of each of the plurality of battery units are effectively OR'd together and provided on line 665 to a Digital to Analog (D/A) converter 680 that converts the output signal that is indicative of the highest temperature of any of the battery units 601A–601N to a digital value that may be provided to the controller 116. That information may then be used by the controller 116 for any of a number of purposes, such as for example, to adjust the charge voltage used to recharge the batteries within the battery units so as to prolong battery life and/or avoid thermal run-away during charging, to sound an alarm, to visually display that information to an operator, etc.

It should be appreciated that the output signal provided on line 665 need not be an analog signal, as it could alternatively be a digital signal. However, the use of an analog signal, rather than a digital signal, reduces the cost and number of components needed to provide such information to the controller. Indeed, the relatively low component count and cost, and the use of standard components with relatively low failure rates and very low power consumption permits battery unit monitoring circuits to be provided with each battery unit with little impact on cost or failure rate of the UPS system. Moreover, because only a single signal line is used, cabling is simplified, and shielded cables need not be used to avoid interference with, or interference from other circuits present in the UPS.

As depicted in FIG. 11A, each battery unit monitoring circuit 605 includes a first resistor R610, a second resistor R620, a thermistor NTC 630, a buffer B650, and a diode D660. The first resistor R610 and the thermistor NTC 630 are connected in series between a supply voltage and a reference terminal, and the second resistor R620 is connected in parallel with the thermistor NTC 630. The thermistor NTC 630 is a Negative Temperature Coefficient (NTC) device having a resistance that decreases in response to an increase in temperature, and would typically be physically disposed in close proximity to the individual batteries within each respective battery unit. It should be appreciated that a plurality of thermistors may alternatively be provided, for example, with each connected in parallel and physically disposed proximate to an individual battery within the respective battery unit 601, as the present invention is not limited to only a single thermistor.

In operation, resistor R610, thermistor NTC 630, and resistor R620 operate as a voltage divider, the output of which is the common connection of R610, NTC 630, and R620. The output of the voltage divider is indicative of the temperature sensed by the thermistor NTC 630. As the temperature of a battery unit rises, the resistance of thermistor NTC 630 decreases, thereby decreasing the combined resistance of NTC 630 and R620, and increasing the voltage dropped across R610.

The output of the voltage divider formed by the common connection of R610, NTC 630 and R620 is connected to the input of a buffer B650 or unity gain amplifier, with the output of the buffer B650 being provided to the cathode of the diode D660. The anode of the diode D660 provides an analog signal on line 665 that may be combined with the signals from other battery units to identify the highest temperature of any of the battery units 601A–601N that are operatively connected thereto. In operation, diode D660 acts as a selection switch selecting the battery unit with the highest temperature (which in the embodiment depicted in FIG. 11A, will provide the lowest voltage).

The output of the diode D660 from each of the battery unit monitoring circuits 605A–N is then provided to an amplifier A670, the input of which is connected, via a pull-up resistor R640 to a supply voltage. Advantageously, the supply voltage to which the pull-up resistor R640 is connected may be the same as the supply voltage to which R610 is connected, permitting the analog bus that connects each of the plurality of battery unit monitoring circuits to include only three conductors; a common signal line 665, a supply voltage line, and a common ground. Amplifier A670 buffers and reduces the amplitude of the signal received on line 665 and provides a buffered and reduced signal on a data line 690. That buffered signal is then provided to an A/D converter 680 that converts the signal received on data line 690 to a digital value and provides the output digital value to the controller 116. The digital value output by the A/D converter is indicative of the highest temperature of any of the individual battery units 601 that are operatively connected to the UPS 100. As discussed further below, pull-up resistor R640, amplifier A670, and A/D converter 680 may be shared amongst the plurality of battery unit monitoring circuits 605A–N to further reduce the number of individual electrical components used to implement the battery monitoring circuit 600.

Figure 11B:
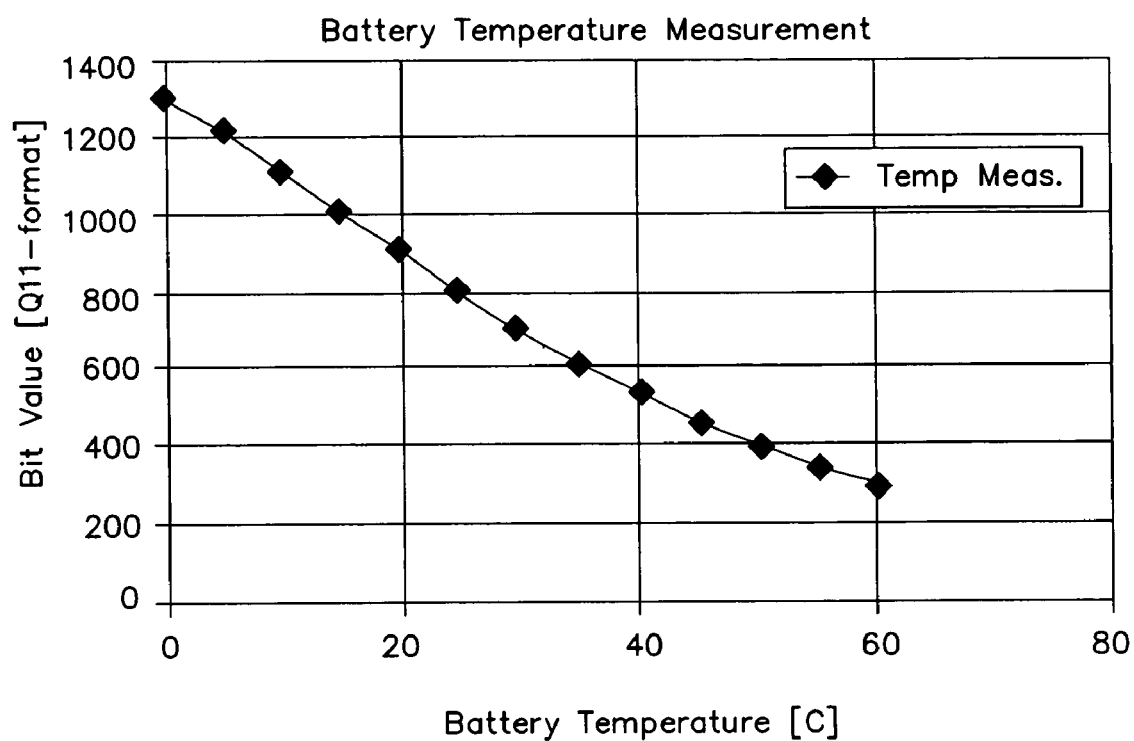
FIG. 11B is a graph depicting the relationship between a bit value and a corresponding temperature for the battery monitoring circuit of FIG. 11A.

In the embodiment illustrated in FIG. 11A, the A/D converter 680 is a 12 bit A/D converter that provides a bit value in a Q-11 format that may range in value between 0 and 1400. However, it should be appreciated that other types of A/D converters, data formats, and ranges may be used, as the present invention is not limited to a particular type of A/D converter, a particular format, or a particular range in values. In accordance with one embodiment of the present invention, the digital value output by the A/D converter 680 may be converted to a temperature by the following equation:

$$T[C] = -3.6737E-08*x^3 + 1.0773E-04*x^2 - 1.5229E-01*x + 96.471;$$

where "x" is the bit value provided by the A/D converter 680. In one embodiment, the bit value may be converted to a temperature in accordance with the above equation by a Digital Signal Processor (DSP) in the controller 116. It should be appreciated that the present invention is not limited to the use of a DSP to convert bit values to a temperature, as a number of alternative methods may be used. For example, rather than utilizing a DSP, a look-up table that may be accessed by the controller 116 may be provided that correlates bit values with temperature. FIG. 11B graphically illustrates how the bit value provided by the A/D converter may correspond to the temperature within a battery unit.

In accordance with one embodiment, the pull-up resistor R640, amplifier A670, and A/D converter 680 may be physically disposed within the UPS 100, rather than within an individual battery unit, although the present invention is not so limited. For example, these components may be physically disposed on a circuit board within the controller 116, such that battery units may be easily added or removed from the system by simply daisy chaining the conductors carrying the supply voltage, the common ground, and the signal line 665. Such a configuration minimizes the cost of each of the individual battery unit monitoring circuits by utilizing only a single D/A converter, rather than replicating this function within each individual battery unit monitoring circuit. Moreover, physically disposing the A/D converter outside the battery unit monitoring circuit avoids any noise issues that may be associated with transmitting digital signals.

In accordance with another embodiment of the present invention, rather than using buffer B650 or a unity gain amplifier in the manner depicted in FIG. 11A, a high gain amplifier may be used instead. This alternative embodiment still permits the analog output signals of each of the plurality of battery units to be effectively OR'd together, but reduces the impact of the diode drop across D660A–N and makes the battery monitoring circuit 600 less sensitive to component variations and/or temperature dependent behavior differences that may be anticipated to occur during production. This embodiment is now described with respect to FIG. 11C.

Figure 11C:
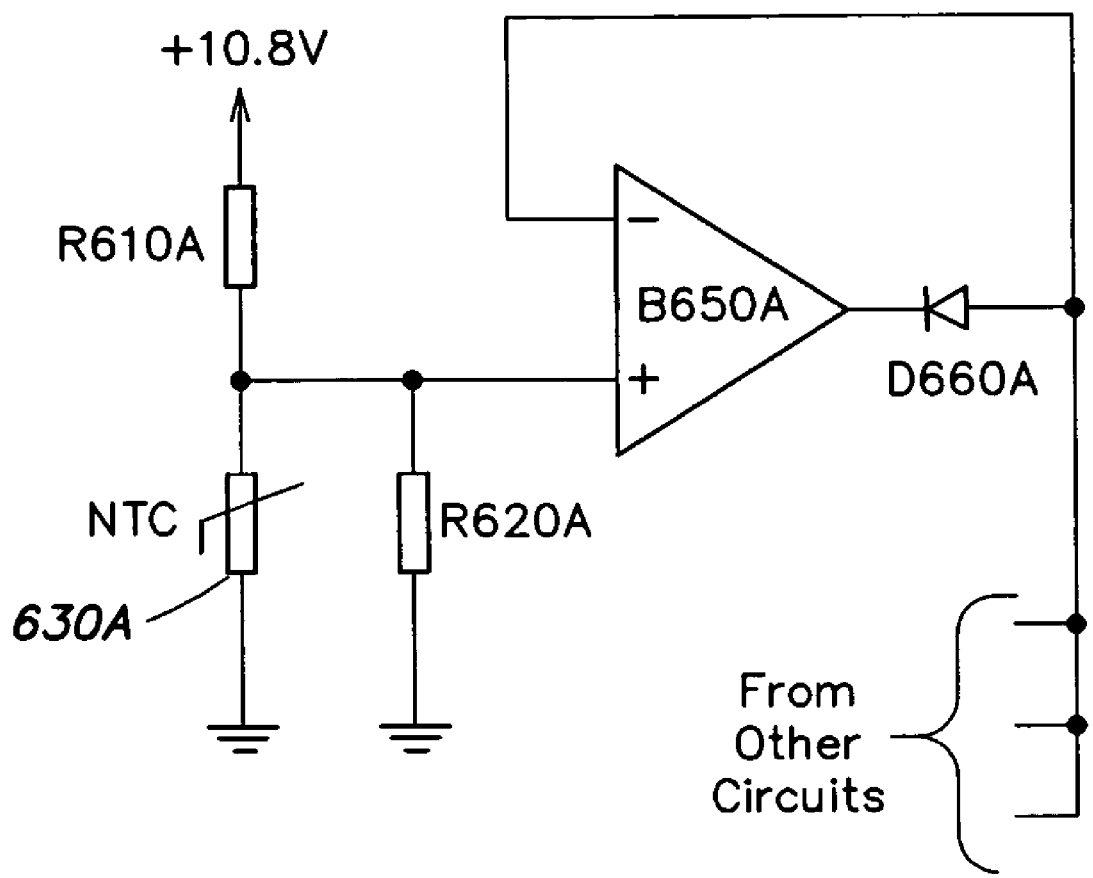
FIG. 11C is a schematic diagram of a buffer circuit that may be used with the battery monitoring circuit of FIG. 11A.

As depicted in FIG. 11C, the output of the voltage divider formed by the common connection of R610, NTC 630, and R620 may be provided to the non-inverting (i.e., positive or +input) of a high gain amplifier, with the output of the high gain amplifier being provided to the cathode of the diode D660. The anode of the diode D660 is connected to the inverting input (i.e., the negative or −input) of the respective high gain amplifier and also connected to the anodes of the diodes from the other battery unit monitoring circuits 605B–N. In this manner, each battery unit monitoring circuit 605 includes the diode D660 within a negative feedback unity gain buffering circuit, and thus the voltage drop across the diode becomes less important to the accuracy of the circuit. This can be significant, as the diode drop across the different diodes D660A–N may suffer from large component variations and may be highly temperature dependent. It should be appreciated that other negative feedback topologies may alternatively be used to implement the operation of the buffer B650 and render the circuit less sensitive to component variations, as the present invention is not limited to the specific configuration shown in FIG. 11C.

In accordance with another embodiment of the present invention, a battery monitoring circuit 700 is provided that is capable of monitoring the number of battery units operatively connected to the UPS 100. From this information, which may be provided to the controller 116, the controller may determine the size, for example, in Amp-hours, of the bank of battery units operatively connected to the UPS 100, and may adjust any run-time algorithms used by the UPS during battery mode operation. The battery monitoring circuit of this embodiment may also detect whether a fuse (or circuit breaker) is blown (or tripped) in any of the externally (or internally) connected battery units. Advantageously, the battery monitoring circuit of this embodiment may be combined with the battery monitoring circuit described above with respect to FIGS. 11A–11C with little additional cabling, and few additional components. In this regard, only a single additional signal line may be added, and only a single passive resistor need be added.

Figure 12:
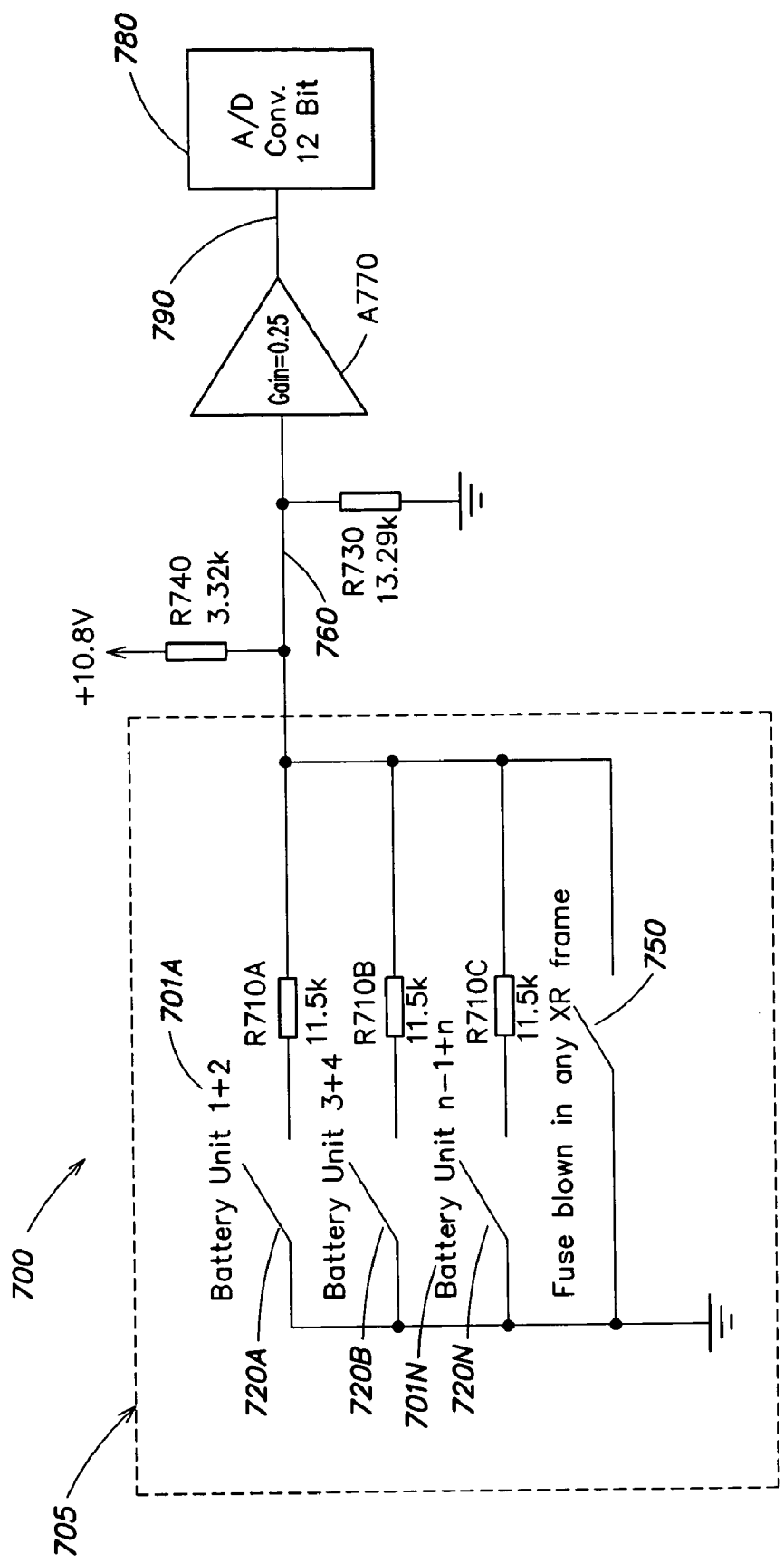
FIG. 12 is a schematic diagram of a second battery monitoring circuit in accordance with one embodiment of the present invention.

As illustrated in FIG. 12, a single resistor R710 is pulled to ground for each set of two battery units 701 installed in a battery frame 705. It should be appreciated that battery 118 of FIG. 3 may be implemented using a number of battery units or modules installed internally in the UPS 100 or externally with all of the battery units operatively connected in parallel, and the battery frame 705 may be an internal battery frame or an external battery frame. Further, each battery unit may include a number of individual batteries coupled in series or in parallel, depending on the requirements of the equipment with which the UPS is used.

The single resistor R710 may be pulled to ground through a switch 720, which may be a mechanical switch or an electronic switch 720, such as a MOS transistor. This switch 720 may be activated manually or electronically through the installation procedure of the battery units. In one embodiment, described in detail below, where the battery monitoring circuit 600 of FIGS. 11A–C is combined with the battery monitoring circuit 700 of FIG. 12, the resistor R710 may be pulled to ground through an electronic switch, such as a MOSFET, that is activated by a voltage comparator that compares the voltage across NTC 630 to identify when a battery unit is connected, without any manual intervention. Alternatively, the switch 720 may be a fuse that is installed for each pair of battery units, one end of which is connected to a common ground.

As depicted in FIG. 12, one terminal of the resistor R710 is connected to the switch or fuse 720, and the other terminal of the resistor R710 is connected to a common signal line 760 that is shared amongst each of the plurality of external (and/or internal) battery units 701 and/or battery frames 705. As additional battery units are connected to the common signal line 760, the effective resistance of the parallel combination of resistors R710 decreases, resulting in an increase in the voltage provided to the common signal line 760. This voltage level may be sensed to determine the number of battery units that are operatively connected to the UPS 100.

Each battery frame 705 may include a switch 750 that is connected between the common signal line 760 and the common ground. The switch 750 may be associated with a fuse or a circuit breaker (not shown), such as where the switch is activated (closed) in the event that the fuse is blown or the circuit breaker is tripped. As known to those skilled in the art, many larger fuses and/or circuit breakers are equipped with an associated switch that is activated by a small pin or other mechanism that pops out when the fuse is blown or the circuit breaker is tripped. The common signal line 760 is pulled hard to the common ground in the event that the fuse or circuit breaker associated with switch 750 is blown or tripped. Such a switch may also be provided in any of the battery units to detect a fault condition. It should be appreciated that in the event that the switch 750 is activated in one of the external or internal battery frames, the common signal line 760 will be pulled to ground, and it may not be possible to detect the number of functional battery units operatively connected to the UPS 100. For this reason, the controller 116 may use conservative values for determining the run-time during battery back-up mode and the level of maximum charging current used to charge the batteries.

The common signal line 760 from each of the pairs of battery units 701 is tied to a supply voltage through a pull-up resistor R740 and to the common ground through a pull-down resistor R730 and provided to the input of an amplifier A770. The amplifier A770 buffers and reduces the amplitude of the signal received on the common signal line 760 and provides the buffered and reduced signal on a data line 790 to the input of a A/D converter 780. The A/D converter converts the signal received on data line 790 to a digital value and provides the output digital value to the controller 116. The digital value output by the A/D converter is indicative of the number of pairs of battery units that are operatively connected to the UPS 100.

In the embodiment illustrated in FIG. 12, the A/D converter 780 is a 12 bit A/D converter that provides a bit value in a Q-11 format that may range in value between 0 and approximately 1200. As will be discussed further below, the bit value provided by the output of the A/D converter 780 is inversely proportional to the number of battery units operatively connected to the UPS 100. It should be appreciated that other types of A/D converters, data formats, and ranges may be used, as the present invention is not limited to a particular type of A/D converter, a particular format, or a particular range in values. In accordance with one embodiment of the present invention, and where each of the pairs of battery units has approximately the same size, in terms of Amp-hours, the total size of the bank of batteries operatively connected to the UPS 100 may be determined in accordance with the following equation:

$$\text{Battery Size[Ah]} = (27584 - 15.6 \cdot x)/x;$$

where "x" is the bit value provided by the A/D converter 780, and each battery unit has a nominal size of approximately 7.2 Ah. Bit values lower than approximately 50 would indicate that a fuse or circuit breaker associated with switch 750 is blown in one of the battery modules.

In one embodiment, the bit value provided by the A/D converter 780 may be converted to a size, in Amp-hours in accordance with the above equation by a Digital Signal Processor (DSP) or other processor in the controller 116. It should be appreciated that the present invention is not limited to the use of a DSP to convert bit values to a size of the battery bank, as a number of alternative methods may be used. For example, rather than utilizing a DSP, a look-up table that may be accessed by the controller 116 may be provided that correlates bit values with the size of the battery bank.

As noted above, in one embodiment of the present invention, each pair of battery units 701 is a fixed size, in terms of Amp-hours, such the size of the bank of batteries operatively connected to the UPS 100 may be readily determined. However, it should be appreciated that the present invention is not limited to battery units or battery modules having a fixed size, as battery units of variable size may also be accommodated. For example, battery units having different sizes could each be provided with a resistor R710 whose resistance value varies dependent upon the size, for example, in terms of Amp-hours, of the battery unit with which it is associated. As an example, the resistance value of the resistor R710 could be inversely proportional to size rating of the associated battery unit.

In accordance with one embodiment of the present invention, resistors R730, R740, amplifier A770 and A/D converter 780 may be physically disposed within the UPS 100, for example, within the controller 116. This permits the cost of that portion of the monitoring circuit provided with the battery units to be minimal, such that battery units may be easily added or removed.

Advantageously, the battery monitoring circuit 700 may be used together with the battery monitoring circuit 600 described above with respect to FIGS. 11A–11B. In this regard, both battery monitoring circuits may share the same supply voltage and common connections, such that an analog bus comprising only four conductors (e.g., signal line 690, signal line 790, and common supply voltage and ground lines) may be used. In one embodiment, where the battery monitoring circuit 600 of FIGS. 11A–C is combined with the battery monitoring circuit 700 of FIG. 12, the resistor R710 may be pulled to ground through an electronic switch 720, such as a MOSFET, that is activated by a voltage comparator. The voltage comparator may compare the voltage across one or each thermistor NTC 630 of each pair of battery units with the output of a fixed voltage divider (e.g., connected to the supply voltage) to distinguish when a battery unit is connected, without requiring any further electrical or mechanical devices or signal lines, and without the need for any manual intervention.

According to another aspect of the present invention, the UPS 100 may include a revision control circuit that is capable of detecting the revision level of individual printed circuit boards within the UPS system and communicating that information to the controller 116. As known to those skilled in the art, during the life of a product, especially a complex product, such as a UPS system, various revisions in hardware or in firmware may be made to one or more of the different circuit boards or modules that are combined to form the product. For example, in a UPS system, a hardware or even firmware change in one of the printed circuit boards or modules may change the scale factor provided by a current sensor, or may affect values for switching frequency, dead-time, etc. used by the power factor correction (PFC) circuit, the inverter(s), or the battery charger. In general, it is desired that new releases of firmware or software used by the controller 116 be capable of safely and/or efficiently operating with older revisions of the various printed circuit boards or modules that together form the UPS system.

Frequently, in conventional UPS systems, the ability to detect the revision status of the various printed circuit boards or modules may be dependent upon an operator being able to physically detect the revision status of each of the various printed circuit boards or modules, and communicate that information to someone with the ability to modify the operation of the controller to accommodate the varying revision levels. Frequently, this may be difficult where the various modules are hidden from view, is prone to human error, and may require the manual re-programming of certain parameters.

However, according to an embodiment of the present invention, an inexpensive and automated manner of detecting the revision status of various modules is provided. This aspect of the present invention is now described with respect to FIG. 13.

Figure 13:
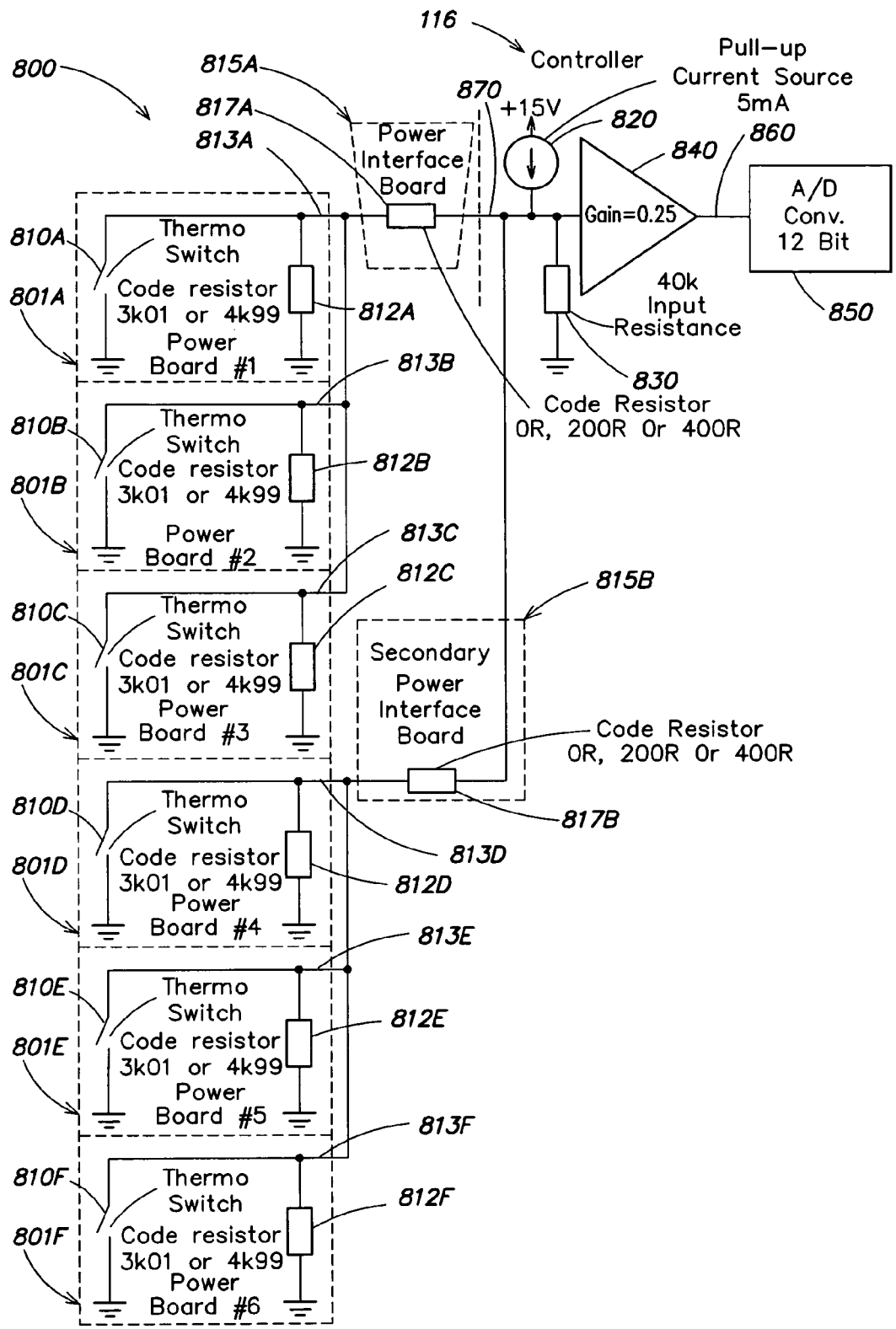
FIG. 13 is a schematic diagram of a board revision detection circuit in accordance with one embodiment of the present invention.

As shown in FIG. 13, the UPS 100 may include a revision control circuit 800 that is capable of identifying the revision status of a plurality of distinct modules or printed circuit boards 801A–F and 815A–B that together may form at least a portion of a UPS system. In accordance with one embodiment of the present invention, the revision control circuit 800 may utilize an analog bus that may include only a single signal line 870 that is distributed amongst the various modules or circuit boards. This single signal line 870 may be daisy chained amongst the various modules or circuit board and provided to the controller 116 in the form of a digital signal that can then be used to modify, if necessary, the operation and parameter values used by the controller to control the operation of the UPS 100.

The simplified schematic representation of the revision control circuit illustrated in FIG. 13 is representative of a larger system in which there are a number of distinct printed circuit boards or modules. For example, in FIG. 13, each of the printed circuit boards 815A and 815B identified as Power Interface Boards might contain modules associated with the battery charger circuit 125 and input/output filters for the rectifier/PFC circuit 114 and the inverter circuit 120, while each of the printed circuit boards 801A–801C and 801D–801F identified as Power Boards may contain modules associated with each phase of the PFC circuit in a three phase UPS system and/or the inverter circuit 120. It should be appreciated that in smaller systems, a fewer number of distinct printed circuit boards or modules would need to be accommodated.

As shown in FIG. 13, each printed circuit board or module 801 includes a thermal switch 810 and a coded resistor 812 that are connected in parallel between a signal line 813 and a common ground. The thermal switch 810 would be expected to be open during normal operating conductions, but becomes a short circuit in the event that a high temperature condition exists on the associated printed circuit board or module 801.

In the embodiment depicted in FIG. 13, each coded resistor 812 may have one of two resistance values indicative of the revision level of that board or module. It should be appreciated that more than two different resistance values may be provided, as the present invention is not limited to only two values. However, it should be appreciated that only a limited number of different resistor values would be needed to reflect relatively significant revisions, as minor revisions that do not require any significant changes in the operation of the controller need not be distinguished. In the illustrated embodiment, each of the printed circuit boards or modules 801A–801C would be expected to have the same revision level, although in a larger UPS system, the revision level of modules 801A–C could differ from those of 801D–F.

Under normal operating conditions (e.g., when a high temperature condition does not exist and thermal switch 810 is closed), each of the printed circuit boards or modules 801 provides one of two resistance values on line 813 that are connected in common. The parallel combination of their resistance will therefore assume one of two resistance values. The combined resistance present on line 813 from each of the printed circuit boards or modules 801 is connected in series with a coded resistor 817 present on printed circuit board or module 815. In the illustrated embodiment, each coded resistor 817 may have one of two resistance values indicative of the revision level of that board or module. It should again be appreciated that more than two resistance values may be provided, as the present invention is not limited to a particular number of resistance values.

The parallel combination of the resistors 817A and 817B each in series with the parallel combination of resistors 812A–C and 812D–F provides one of seven different resistance values (or ranges of resistance values) that can be used to detect the revision status of each of the printed circuit boards or modules 801A–F and 815A–B, as illustrated in Tables 3 and 4 and discussed further below. The combined resistance value on signal line 870 is provided to an amplifier 840, the input of which is connected to a current source 820 and a resistor 830. Amplifier 840 buffers and reduces the amplitude of the signal received on signal line 870 and provides the buffered and reduced signal to the input of an A/D converter 850 on line 860.

In the embodiment illustrated in FIG. 13, the A/D converter 850 is a 12 bit A/D converter that provides a bit value in a Q-11 format that may range in value between −2048 and approximately 2048. As indicated with respect to tables 3 and 4 below, the bit value provided by the output of the A/D converter 850 is indicative of the revision status of the printed circuit boards or modules 801A–F and 815A–B. In the tables below, Table 3 represents the revision status level of printed circuit boards 801A–F and 815A–B based upon the measured bit value provided by A/D converter 850 for a smaller (10/15 kVA 208V and 15/20 kVA 400V) UPS system, and Table 4 represents the revision status level of printed circuit boards 801A–F and 815A–B based upon the measured bit value provided by A/D converter 850 for a larger (20/30 kVA 208V and 30/40 kVA 400V) UPS system.

TABLE 3

| Measured bit value | Power Board revision # | Power Interface Board revision # |
|---|---|---|
| −2048 to 465 | High heat sink temperature, board revisions n.a. | |
| 466 to 1099 | 1 | 1 |
| 1100 to 1293 | 1 | 2 |
| 1294 to 1512 | 1 | 3 |
| 1513 to 1729 | 2 | 1 |
| 1730 to 1917 | 2 | 2 |
| 1918 to 2048 | 2 | 3 |

TABLE 4

| Measured bit value | Power Board revision # | Power Interface Board revision # |
|---|---|---|
| −2048 to 465 | High heat sink temperature, board revisions n.a. | |
| 466 to 557 | 1 | 1 |
| 558 to 657 | 1 | 2 |
| 658 to 770 | 1 | 3 |
| 771 to 883 | 2 | 1 |
| 884 to 981 | 2 | 2 |
| 982 to 2048 | 2 | 3 |

It should be appreciated that other types of A/D converters, data formats, and ranges may be used, as the present invention is not limited to a particular type of A/D converter, a particular format, or a particular range in values. In accordance with one embodiment of the present invention, the bit value provided by the A/D converter 850 is read by a processor in the controller 116 and compared to a look-up table stored in a memory of the controller 116. The controller 116 may then determine the appropriate parameters and/or control routines to use. Typically the bit value provided by the A/D converter 850 would be read during an initialization routine by the controller 116, or when a printed circuit board or module is hot-swapped in the power-on state, although the present invention is not so limited.

Although the embodiment of FIG. 13 has been described with respect to seven different resistance values or ranges of resistance values (e.g., six different values or ranges of value corresponding to different revision levels of the printed circuit boards or modules 801A–F and 815A–B, and one value or range of value corresponding to a high temperature or open circuit condition), it should be appreciated that more than seven different revision status levels may be detected. For example, additional resistance values may be provided for the resistors 812 and 817, and the ranges of bit values narrowed to accommodate same.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. An uninterruptible power supply for providing power to a load, the uninterruptible power supply comprising:
   an input to receive input power;
   an output to provide output power;
   an input power circuit coupled to the input and having a DC output that provides DC power having a first DC voltage level;
   a capacitor having a first end coupled to the DC output of the input power circuit and having a second end;
   a back-up power source coupled to the input power circuit;
   an output power circuit coupled to the DC output of the input power circuit and to the output of the uninterruptible power supply to provide the output power; and
   a capacitor discharge circuit coupled to the first end of the capacitor and the second end of the capacitor and configured in a first mode of operation to discharge a voltage across the capacitor, such that an average discharge current through the discharge circuit is inversely proportional to a voltage across the capacitor for a first range of voltages across the capacitor;
   wherein the capacitor discharge circuit is configured in a second mode of operation such that the discharge current through the discharge circuit is proportional to the voltage across the capacitor for a second range of voltages that is less than the first range of voltages.

2. The uninterruptible power supply of claim 1, wherein the capacitor discharge circuit is configured in the first mode of operation to control the discharge current, such that the discharge current has a waveform containing a series of pulses with a duty cycle of the pulses being inversely proportional to the voltage across the capacitor over at least the first range of voltages.

3. The uninterruptible power supply of claim 2, wherein the first range of voltages is equal to a range of voltages from a lower threshold level to the first DC voltage level, and the second range of voltages is equal to a range of voltages from zero to the lower threshold level.

4. The uninterruptible power supply of claim 3, wherein the capacitor discharge circuit includes:
   a passive discharge circuit having an input coupled to the first end of the capacitor and an output;
   a switch having an input coupled to the output of the passive discharge circuit and an output coupled to the second end of the capacitor; and
   a control circuit coupled to the switch to control an operational state of the switch based on the voltage across the capacitor.

5. The uninterruptible power supply of claim 4, wherein the capacitor discharge circuit includes:
   a passive discharge circuit having an input coupled to the first end of the capacitor and an output;
   a switch having an input coupled to the output of the passive discharge circuit and an output coupled to the second end of the capacitor; and
   a control circuit coupled to the switch to control an operational state of the switch based on the voltage across the capacitor.

6. An uninterruptible power supply for providing power to a load, the uninterruptible power supply comprising:
   an input to receive input power;
   an output to provide output power;
   an input power circuit coupled to the input and having a DC output that provides DC power having a first DC voltage level;
   a capacitor having a first end coupled to the DC output of the input power circuit and having a second end;
   a back-up power source coupled to the input power circuit;

an output power circuit coupled to the DC output of the input power circuit and to the output of the uninterruptible power supply to provide the output power;

means for discharging a voltage across the capacitor, such that an average discharge current of the capacitor is inversely proportional to a voltage across the capacitor for a first range of voltages across the capacitor; and means for discharging the voltage across the capacitor such that the discharge current is proportional to the voltage across the capacitor for a second range of voltages that is less than the first range of voltages.

7. The uninterruptible power supply of claim 6, further comprising means for discharging the voltage across the capacitor such that the discharge current has a waveform containing a series of pulses with a duty cycle of the pulses being inversely proportional to the voltage across the capacitor over at least the first range of voltages.

8. The uninterruptible power supply of claim 7, wherein the first range of voltages is equal to a range of voltages from a lower threshold level to the first DC voltage level, and the second range of voltages is equal to a range of voltages from zero to the lower threshold level.

9. The uninterruptible power supply of claim 6, wherein the first range of voltages is equal to a range of voltages from a lower threshold level to the first DC voltage level, and the second range of voltages is equal to a range of voltages from zero to the lower threshold level.

10. An uninterruptible power supply for providing power to a load, the uninterruptible power supply comprising:

an input to receive input power;

an output to provide output power;

an input power circuit coupled to the input and having a DC output that provides DC power having a first DC voltage level;

a capacitor having a first end coupled to the DC output of the input power circuit and having a second end;

a back-up power source coupled to the input power circuit;

an output power circuit coupled to the DC output of the input power circuit and to the output of the uninterruptible power supply to provide the output power;

means for discharging a voltage across the capacitor, such that an average discharge current of the capacitor is inversely proportional to a voltage across the capacitor for a first range of voltages across the capacitor; and means for discharging the voltage across the capacitor such that the discharge current has a waveform containing a series of pulses with a duty cycle of the pulses being inversely proportional to the voltage across the capacitor over at least the first range of voltages.

11. A method of discharging a voltage across a capacitor in an uninterruptible power supply, the method comprising:

charging the capacitor to a first voltage value;

detecting the voltage across the capacitor;

discharging the capacitor using a discharge current having an average value that is inversely proportional to the voltage across the capacitor, such that over at least a first range of voltages across the capacitor, the average value of the discharge current increases as the voltage across the capacitor decreases;

during discharge of the capacitor, detecting that the voltage across the capacitor has decreased to a second voltage value, less than the first voltage value; and discharging the capacitor using a discharge current having an average value that is proportional to the voltage across the capacitor, such that for a second range of voltages the average value of the discharge current decreases as the voltage across the capacitor decreases.

12. The method of claim 11, further comprising controlling the discharge current, while the voltage across the capacitor is within the first voltage range, such that the discharge current has a waveform containing a series of pulses with a duty cycle of the pulses being inversely proportional to the voltage across the capacitor over the first range of voltages.

13. The method of claim 12, further comprising controlling the discharge current to be continuous over the second range of voltages.

14. The method of claim 13, wherein the first range of voltages is equal to a range of voltages from the first voltage value to the second voltage value, and the second range of voltages is equal to a range of voltages from the second voltage value to a voltage level of zero.

15. The method of claim 11, further comprising controlling the discharge current to be continuous over the second range of voltages.

16. The method of claim 11, wherein the first range of voltages is equal to a range of voltages from the first voltage value to the second voltage value, and the second range of voltages is equal to a range of voltages from the second voltage value to a voltage level of zero.

17. A method of discharging a voltage across a capacitor in a uninterruptible power supply, the method comprising:

charging the capacitor to a first voltage value;

detecting the voltage across the capacitor;

discharging the capacitor using a discharge current having an average value that is inversely proportional to the voltage across the capacitor, such that over at least a first range of voltages across the capacitor, the average value of the discharge current increases as the voltage across the capacitor decreases; and controlling the discharge current, while the voltage across the capacitor is within the first range of voltages such that the discharge current has a waveform containing a series of pulses with a duty cycle of the pulses being inversely proportional to the voltage across the capacitor over the first range of voltages.

* * * * *